United States Patent
Eldridge et al.

(10) Patent No.: US 8,354,855 B2
(45) Date of Patent: Jan. 15, 2013

(54) CARBON NANOTUBE COLUMNS AND METHODS OF MAKING AND USING CARBON NANOTUBE COLUMNS AS PROBES

(75) Inventors: Benjamin N. Eldridge, Danville, CA (US); Treliant Fang, Dublin, CA (US); Gaetan L. Mathieu, Varennes, CA (US); Onnik Yaglioglu, Oakland, CA (US)

(73) Assignee: FormFactor, Inc., Livermore, CA (US)

( * ) Notice: Subject to any disclaimer, the term of this patent is extended or adjusted under 35 U.S.C. 154(b) by 412 days.

(21) Appl. No.: 12/632,428

(22) Filed: Dec. 7, 2009

(65) Prior Publication Data

US 2010/0083489 A1 Apr. 8, 2010

Related U.S. Application Data

(63) Continuation-in-part of application No. 11/872,008, filed on Oct. 13, 2007, now Pat. No. 8,130,007.

(60) Provisional application No. 61/242,206, filed on Sep. 14, 2009, provisional application No. 60/829,674, filed on Oct. 16, 2006, provisional application No. 60/938,673, filed on May 17, 2007.

(51) Int. Cl.
*G01R 31/00* (2006.01)
*G01R 31/20* (2006.01)
*G01R 1/067* (2006.01)

(52) U.S. Cl. .......... 324/756.03; 324/755.01; 324/754.01

(58) Field of Classification Search .......... None
See application file for complete search history.

(56) References Cited

U.S. PATENT DOCUMENTS

| | | | |
|---|---|---|---|
| 6,020,747 | A | 2/2000 | Bahns et al. |
| 6,232,706 | B1 | 5/2001 | Dai et al. |
| 6,346,189 | B1 | 2/2002 | Dai et al. |
| 6,401,526 | B1 | 6/2002 | Dai et al. |
| 6,457,350 | B1 | 10/2002 | Mitchell |
| 6,597,090 | B1 | 7/2003 | Mancevski |
| 6,626,684 | B1 | 9/2003 | Stickler et al. |
| 6,800,865 | B2 | 10/2004 | Nakayama et al. |

(Continued)

FOREIGN PATENT DOCUMENTS

EP 1830367 9/2007

(Continued)

OTHER PUBLICATIONS

Andrews et al., "Continuous production of aligned carbon nanotubes: a step closer to commerical realization," Chemical Physics Letters 303 (Apr. 16, 1999), pp. 467-474.

(Continued)

*Primary Examiner* — Paresh Patel
(74) *Attorney, Agent, or Firm* — Kirton McConkie

(57) ABSTRACT

Carbon nanotube columns each comprising carbon nanotubes can be utilized as electrically conductive contact probes. The columns can be grown, and parameters of a process for growing the columns can be varied while the columns grow to vary mechanical characteristics of the columns along the growth length of the columns. Metal can then be deposited inside and/or on the outside of the columns, which can enhance the electrical conductivity of the columns. The metalized columns can be coupled to terminals of a wiring substrate. Contact tips can be formed at or attached to ends of the columns. The wiring substrate can be combined with other electronic components to form an electrical apparatus in which the carbon nanotube columns can function as contact probes.

7 Claims, 25 Drawing Sheets

U.S. PATENT DOCUMENTS

| | | | |
|---|---|---|---|
| 6,863,942 B2 | 3/2005 | Ren et al. |
| 6,890,506 B1 | 5/2005 | Harutyunyan et al. |
| 6,933,222 B2 | 8/2005 | Dubin et al. |
| 6,967,013 B2 | 11/2005 | Someya et al. |
| 6,979,244 B2 | 12/2005 | Den et al. |
| 7,012,441 B2 | 3/2006 | Chou et al. |
| 7,082,683 B2 | 8/2006 | Han et al. |
| 7,094,123 B2 | 8/2006 | Oyama et al. |
| 7,132,039 B2 | 11/2006 | Anasawa et al. |
| 7,147,966 B2 | 12/2006 | Ren et al. |
| 7,160,531 B1 | 1/2007 | Jacques et al. |
| 7,189,430 B2 | 3/2007 | Ajayan et al. |
| 7,226,663 B2 | 6/2007 | Jiao et al. |
| 7,250,188 B2 | 7/2007 | Dodelet et al. |
| 7,251,884 B2 | 8/2007 | Grube et al. |
| 7,258,901 B1 | 8/2007 | Lee et al. |
| 7,378,328 B2 | 5/2008 | Choi et al. |
| 7,400,159 B2 | 7/2008 | Wang et al. |
| 7,439,731 B2 * | 10/2008 | Crafts et al. ............ 324/756.03 |
| 7,585,548 B2 | 9/2009 | Wang et al. |
| 7,710,106 B2 | 5/2010 | Crafts et al. |
| 7,731,503 B2 | 6/2010 | Eldridge et al. |
| 8,130,007 B2 | 3/2012 | Eldridge et al. |
| 8,149,007 B2 | 4/2012 | Chen et al. |
| 2003/0010910 A1 | 1/2003 | Colbert et al. |
| 2003/0153965 A1 | 8/2003 | Supronowicz et al. |
| 2003/0179559 A1 | 9/2003 | Engelhardt et al. |
| 2004/0036403 A1 | 2/2004 | Ono et al. |
| 2004/0110003 A1 | 6/2004 | Cumings et al. |
| 2004/0113621 A1 | 6/2004 | Naughton |
| 2004/0208788 A1 | 10/2004 | Colton |
| 2005/0019245 A1 | 1/2005 | Koulikov |
| 2005/0285116 A1 | 12/2005 | Wang |
| 2006/0028220 A1 | 2/2006 | Malantonio et al. |
| 2006/0071334 A1 | 4/2006 | Kawabata et al. |
| 2006/0073089 A1 | 4/2006 | Ajayan et al. |
| 2006/0103406 A1 | 5/2006 | Kitazawa et al. |
| 2006/0188721 A1 | 8/2006 | Irvin et al. |
| 2006/0197547 A1 | 9/2006 | Chen |
| 2006/0198956 A1 | 9/2006 | Eres |
| 2006/0252853 A1 | 11/2006 | Ajayan et al. |
| 2006/0290343 A1 | 12/2006 | Crafts et al. |
| 2007/0004191 A1 | 1/2007 | Gu et al. |
| 2007/0018098 A1 | 1/2007 | Nakayama et al. |
| 2007/0051887 A1 | 3/2007 | Hidaka et al. |
| 2007/0155158 A1 | 7/2007 | Gstrein et al. |
| 2007/0158584 A1 | 7/2007 | Lin |
| 2007/0158768 A1 | 7/2007 | Pilchowski et al. |
| 2007/0164214 A1 | 7/2007 | Choi et al. |
| 2007/0186665 A1 | 8/2007 | Hierold et al. |
| 2007/0213419 A1 | 9/2007 | Cao et al. |
| 2007/0218202 A1 | 9/2007 | Ajayan et al. |
| 2007/0235713 A1 | 10/2007 | Swirbel |
| 2007/0237990 A1 | 10/2007 | Kim |
| 2009/0066352 A1 | 3/2009 | Gritters et al. |
| 2009/0091343 A1 | 4/2009 | Wu et al. |
| 2009/0197484 A1 | 8/2009 | Chen et al. |
| 2010/0252317 A1 | 10/2010 | Gritters et al. |
| 2010/0253375 A1 | 10/2010 | Fang et al. |
| 2011/0018566 A1 | 1/2011 | Crafts et al. |
| 2012/0086004 A1 | 4/2012 | Fang et al. |

FOREIGN PATENT DOCUMENTS

| | | |
|---|---|---|
| EP | 1845124 | 10/2007 |
| KR | 10-2009-0071644 | 7/2009 |
| WO | WO 00/73204 | 12/2000 |
| WO | WO 03/004155 | 1/2003 |
| WO | WO 2004/102582 | 11/2004 |
| WO | WO 2005/017977 | 2/2005 |
| WO | WO 2006/057659 | 6/2006 |
| WO | WO 2007/033188 | 3/2007 |
| WO | WO 2007/139244 | 12/2007 |
| WO | WO 2008/024726 | 2/2008 |
| WO | WO 2008/048938 | 4/2008 |

OTHER PUBLICATIONS

Int'l patent application No. PCT/US2010/048129, Search Report and Written Opinion (Jun. 30, 2011), 10 pages.

U.S. Appl. No. 11/466,039, filed Aug. 21, 2006, Eldridge et al.

U.S. Appl. No. 12/418,368, filed Apr. 3, 2009, Gritters et al.

U.S. Appl. No. 12/418,438, filed Apr. 3, 2009, Fang et al.

Moloni et al., "Sharpened Carbon Nanotubes Probes" (University of Wisconsin-Madison) (no date but downloaded from Internet on Sep. 6, 2007) (8 pages).

Pushparaj et al., "Effects of compressive strains on electrical conductivities of a macroscale carbon nanotube block," Applied Physics Letters 91, 153116 (2007) (3 pages).

Yaglioglu et al., "Conductive Carbon Nanotube Composite Micro-Probes," Advanced Materials (2008), 20, pp. 357-362.

Yaglioglu et al., "Transfer and Reinforcement of Carbon Nanotube Structures with Epoxy," Precision Engineering Research Group, Dept. of Mechanical Engineering, Massachusetts Institute of Technology (presented at NTOG conference in Japan, Jun. 2006) (1 page).

Yaglioglu, "Carbon Nanotube Based Electromechanical Probes," Thesis (Massachusetts Institute of Technology Jun. 2007) (137 pages).

Greene, "Researchers Make Carbon Nanotubes Without Metal Catalyst," MIT News (Aug. 10, 2009) (2 pages).

Int'l patent application No. PCT/US2010/048129, International Preliminary Report on Patentability (Mar. 29, 2012), 6 pages.

Hutchens et al., "In situ Mechanical Testing Reveals Periodic Buckle Nucleation and Propagation in Carbon Nanotube Bundles," Adv. Funct. Mater. 2010, 20 (Wiley-VCH Verlag GmbH & Co.) (2010), pp. 2338-2346.

Yaglioglu et al., "Method of Characterizing Electrical Contact Properties of Carbon Nanotube Coated Surfaces," Review of Scientific Instruments 77, 095105 (American Institute of Physics 2006), 3 pages.

* cited by examiner

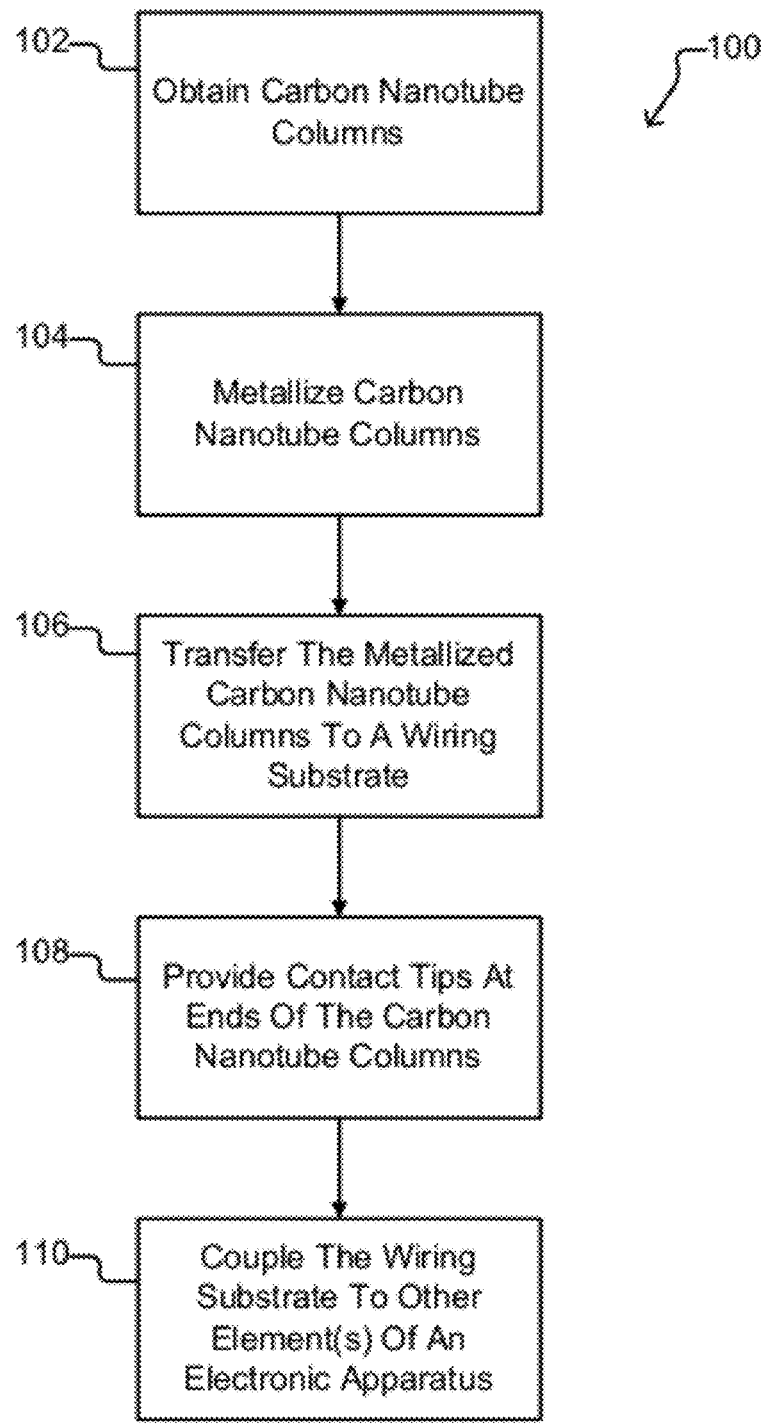

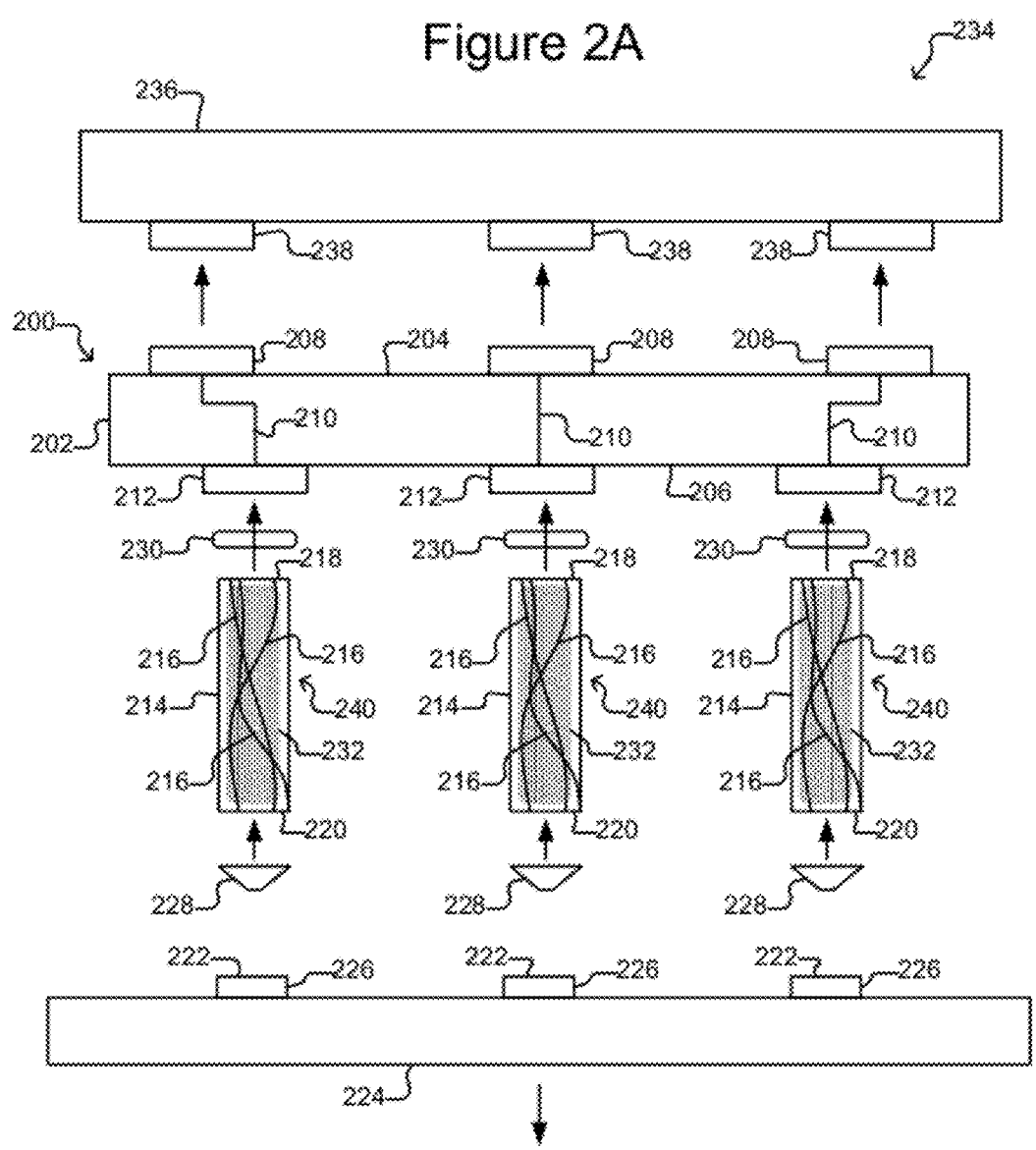

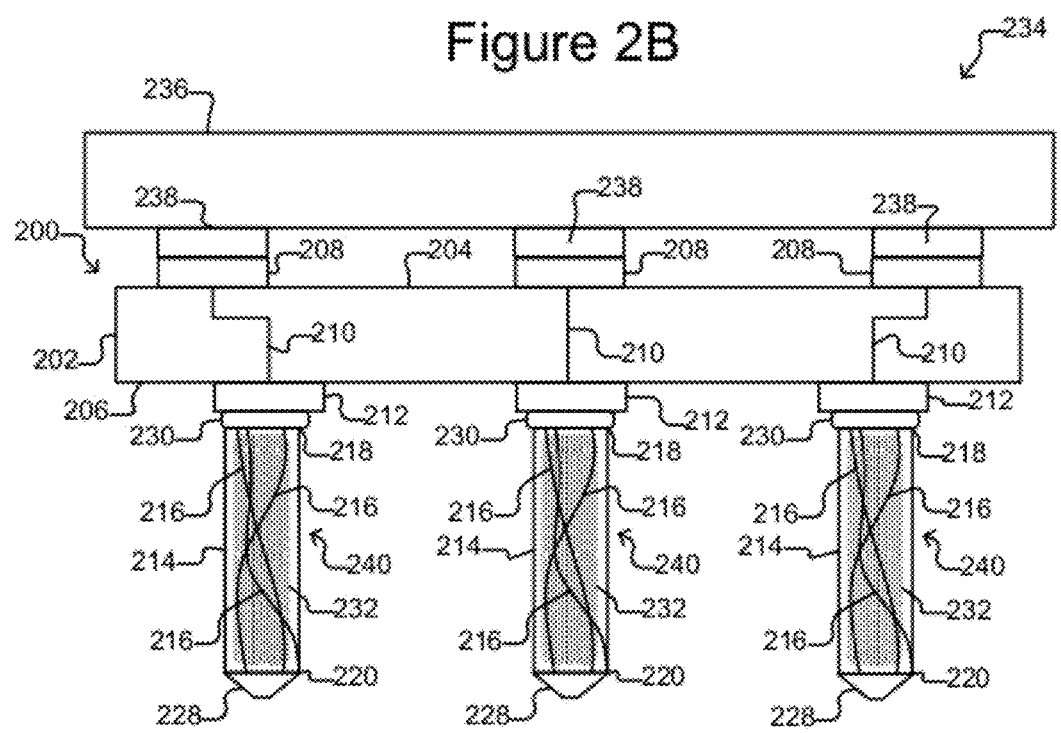

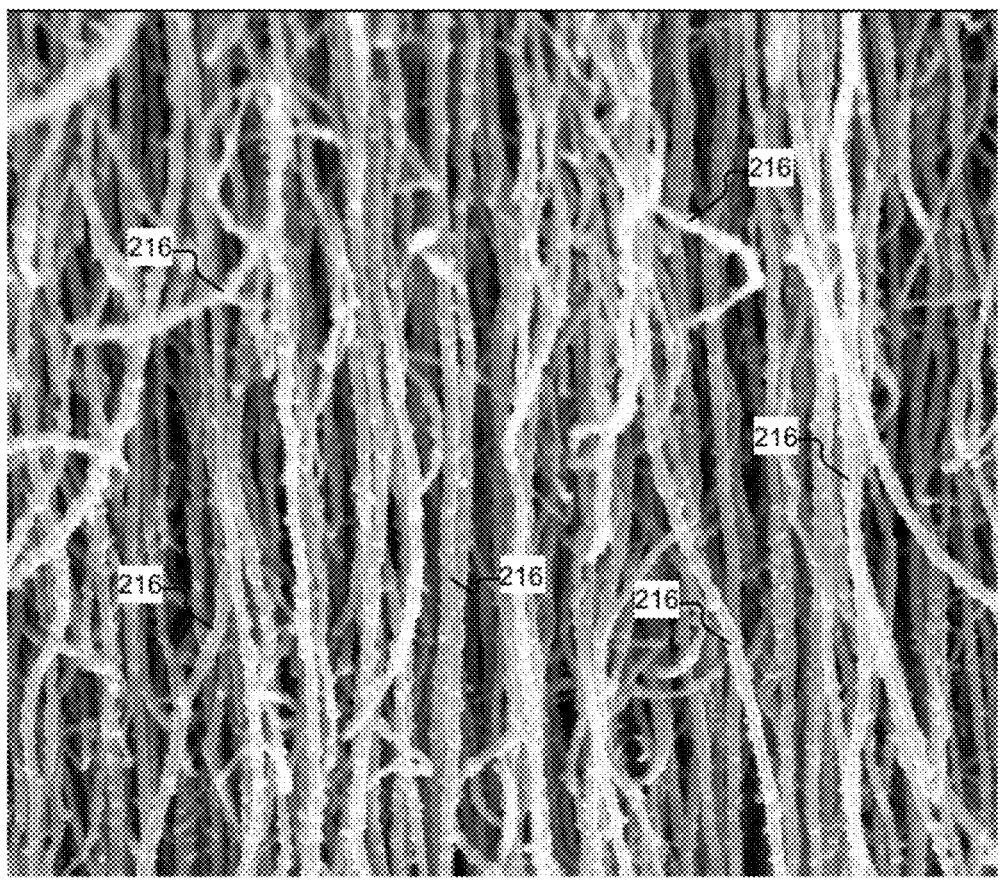

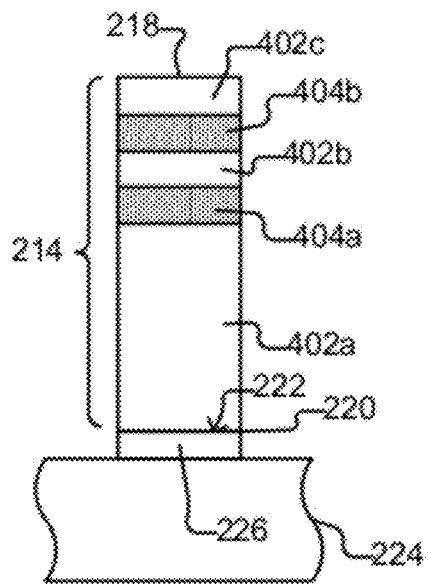
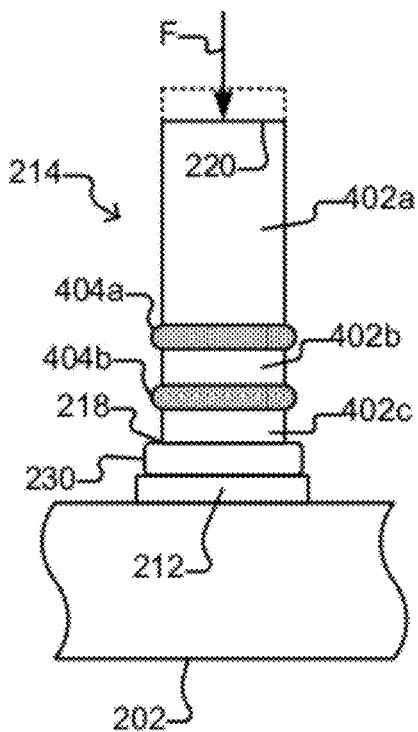

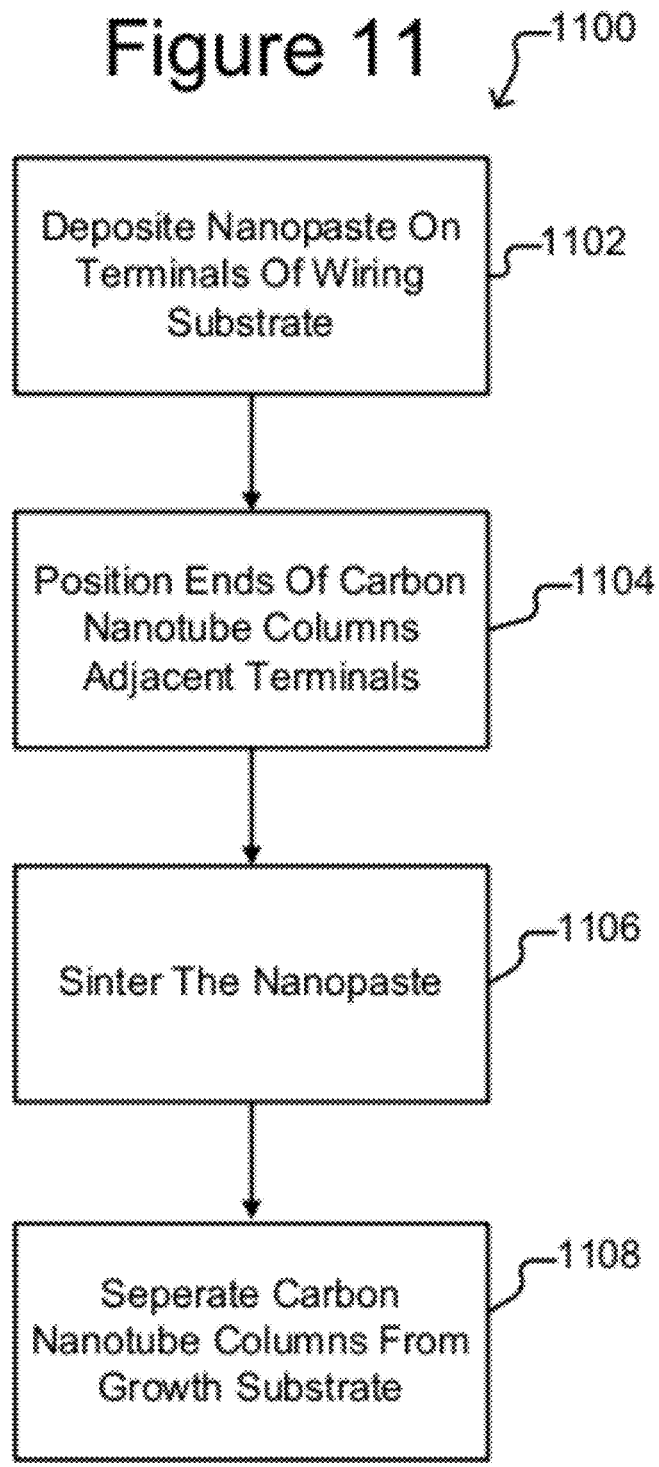

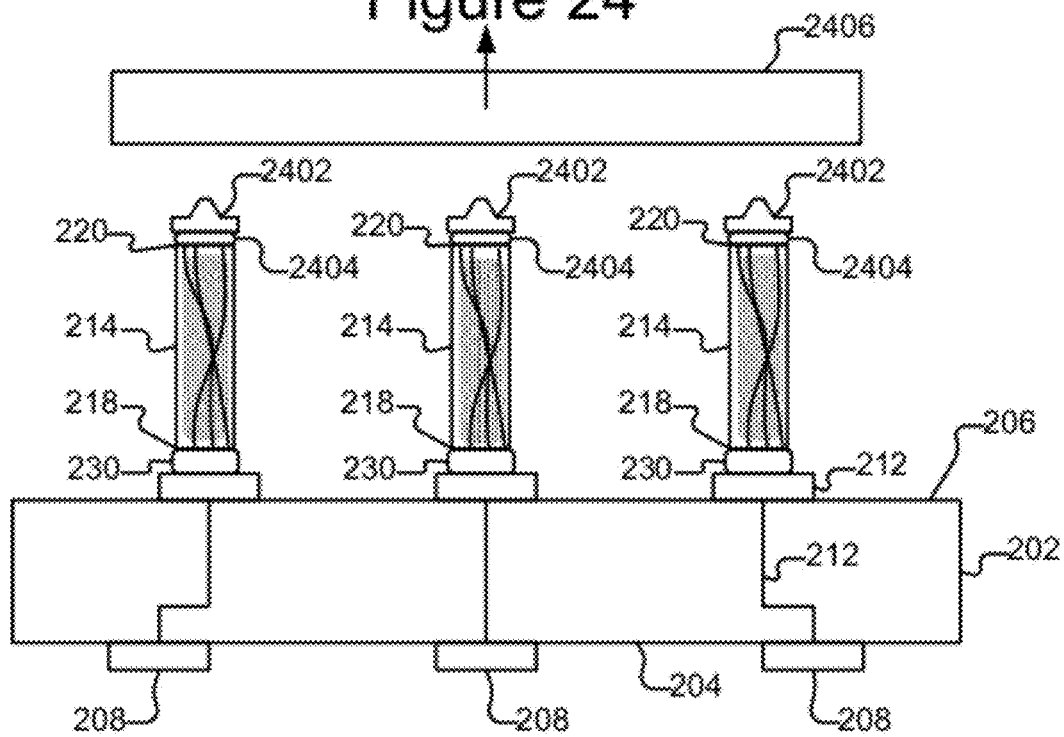

CARBON NANOTUBE COLUMNS AND METHODS OF MAKING AND USING CARBON NANOTUBE COLUMNS AS PROBES

CROSS REFERENCE TO RELATED APPLICATION(S)

This application is a non-provisional (and thus claims the benefit of the filing date) of U.S. provisional patent application Ser. No. 61/242,206 (filed Sep. 14, 2009), which is incorporated herein by reference in its entirety. This application is also a continuation-in-part of U.S. patent application Ser. No. 11/872,008, filed Oct. 13, 2007 (published as U.S. Patent Application Publication No. 2009/0066352), which is also incorporated herein by reference in its entirety. The application Ser. No. 11/872,008 is a non-provisional (and thus claims the benefit of the filing date) of U.S. provisional patent application Ser. No. 60/829,674 (filed Oct. 16, 2006) and U.S. provisional patent application Ser. No. 60/938,673 (filed May 17, 2007).

BACKGROUND

Electrically conductive spring probes on an electronic device can make temporary, pressure based electrical connections with terminals or other such input and/or outputs of a second electronic device. For example, such probes on the electronic device can be pressed against the terminals of the second electronic device to make temporary electrical connections between the probes and the terminals and thus between the electronic device and the second electronic device. Embodiments of the present invention are directed to carbon nanotube columns as spring probes and methods of making and using spring probes that comprise carbon nanotube columns.

SUMMARY

In some embodiments, a process of growing a carbon nanotube column can include varying at least one parameter of the process to vary at least one mechanical characteristic of the column. For example, a growth solution comprising a carbon source and a catalyst can be introduced into a carrier gas to produce a growth gas, and the growth gas can be introduced into a chamber containing a substrate with a growth surface such that a carbon nanotube column comprising a plurality of bundled carbon nanotubes grows on the growth surface using the carbon source. While the carbon nanotube column grows on the growth surface, at least one parameter relating to introducing the growth solution or the growth gas into the chamber can be varied to produce a varying mechanical characteristic of the carbon nanotube column.

In some embodiments, a nanopaste can couple a carbon nanotube column to a terminal of a wiring substrate. For example, a nanopaste comprising electrically conductive nanoparticles can be disposed on a terminal of a wiring substrate, and a first end of a carbon nanotube column can be disposed in the nanopaste. The nanopaste can then be sintered, which can fuse at least some of the nanoparticles together and to the terminal and the first end of the carbon nanotube column, which can physically and electrically couple the carbon nanotube column to the terminal.

In some embodiments, a probe card assembly can be made with a plurality of carbon nanotube columns. For example, a plurality of carbon nanotube columns on a growth substrate can be obtained. The carbon nanotube columns can be disposed a pattern that corresponds to terminals of an electronic device to be tested. Each of the carbon nanotube columns can comprise a plurality of bundled carbon nanotubes at least some of which can be intertwined. Electrically conductive metal can be deposited on at least some of the carbon nanotubes of each of the carbon nanotube columns, and the carbon nanotube columns can be transferred from the growth substrate to terminals of a probe substrate. The probe substrate can be mechanically and electrically coupled to a wiring substrate that includes an electrical interface to a tester for controlling testing of the electronic device, and the carbon nanotube columns can be electrically connected through the probe substrate and the wiring substrate to the electrical interface.

In some embodiments, a probe card assembly can comprise a wiring substrate and a probe substrate. The wiring substrate can comprise an electrical interface to a tester for controlling testing of an electronic device to be tested. The probe substrate can comprise a plurality of probes disposed in a pattern that corresponds to terminals of the electronic device to be tested, and each of the probes can comprise a carbon nanotube column, which can comprise a bundle of carbon nanotubes sintered to a terminal of the probe substrate. The probe substrate can be mechanically coupled to the wiring substrate, and the probes can be electrically connected through the probe substrate and the wiring substrate to the electrical interface.

BRIEF DESCRIPTION OF THE DRAWINGS

FIG. 1 illustrates an example of a process for making a contactor device with probes comprising carbon nanotube columns according to some embodiments of the invention.

FIG. 2A illustrates an example of an implementation of the process of FIG. 1 to make a contactor device according to some embodiments of the invention.

FIG. 2B illustrates the contactor device of FIG. 2A assembled.

FIG. 2C shows a photograph of a carbon nanotube column according to some embodiments of the invention.

FIG. 4A illustrates an example of a carbon nanotube column grown while varying one or more of the parameters of the system of FIG. 3 in order to obtain one or more soft regions along the carbon nanotube column according to some embodiments of the invention.

FIG. 4C illustrates an example in which the soft region(s) of the carbon nanotube column compress in response to a force on an end of the carbon nanotube column according to some embodiments of the invention.

FIG. 11 illustrates an example of a process of transferring carbon nanotube columns from a growth substrate to a wiring substrate according to some embodiments of the invention.

FIG. 24 illustrates an example of transferring contact tip structures formed on a substrate to ends of carbon nanotube columns according to some embodiments of the invention.

DETAILED DESCRIPTION OF EXEMPLARY EMBODIMENTS

Figure 3:
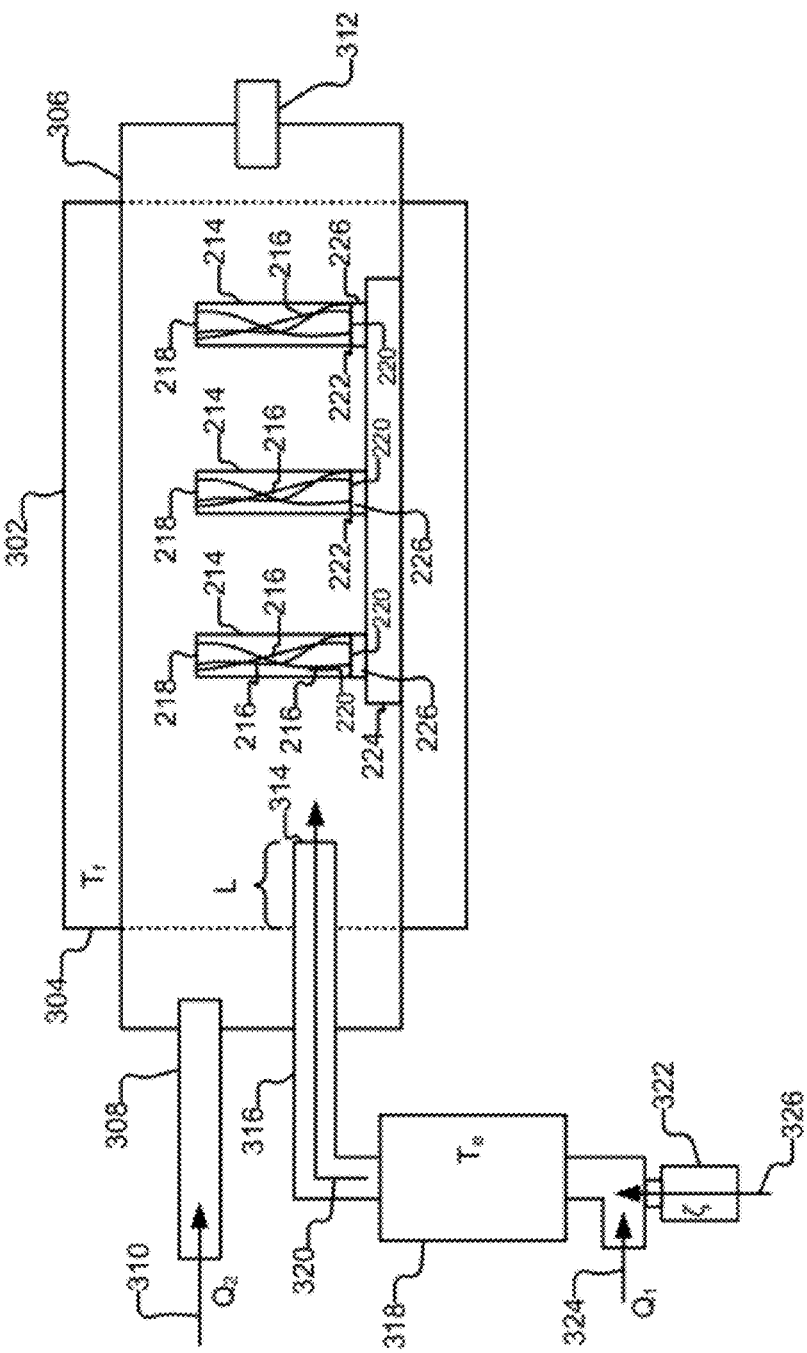
FIG. 3 illustrates an example of a growth system for growing carbon nanotube columns according to some embodiments of the invention.

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on," "attached to," or "coupled to" are used herein, one object (e.g., a material, a layer, a substrate, etc.) can be "on," "attached to," or "coupled to" another object regardless of whether the one object is directly on, attached, or coupled to the other object or there are one or more intervening objects between the one object and the other object. Also, directions (e.g., above, below, top, bottom, side, up, down, under, over, upper, lower, horizontal, vertical, "x," "y," "z," etc.), if provided, are relative and provided solely by way of example and for ease of illustration and discussion and not by way of limitation. In addition, where reference is made to a list of elements (e.g., elements a, b, c), such reference is intended to include any one of the listed elements by itself, any combination of less than all of the listed elements, and/or a combination of all of the listed elements.

FIG. 1 illustrates an example of a process 100 for making an electronic apparatus that includes a contactor device with probes each of which comprises a carbon nanotube column according to some embodiments of the invention. As used herein, a carbon nanotube column comprises a group of bundled carbon nanotubes that is generally vertically aligned, although some of the carbon nanotubes in the group can overlap, be comingled or intertwined, or otherwise contact one or more other carbon nanotubes in one or more places. Also, in some embodiments, not all of the carbon nanotubes in a column need extend the entire length of the column. For example, see FIG. 2C, which illustrates a photograph of an example of a carbon nanotube column 214 comprising individual carbon nanotubes 216 a few of which are labeled.

FIG. 2A illustrates an example of an implementation of the process 100 of FIG. 1 in which an electronic apparatus 234 with probes 240 each comprising a carbon nanotube column 214 is made according to some embodiments of the invention. FIG. 2B illustrates the electronic apparatus 234 assembled. FIGS. 3-24 illustrate examples of one or more steps of the process 100 of FIG. 1. Prior to discussing the examples in FIGS. 3-24, however, an overview of the process 100 is provided as follows.

As shown in FIG. 1, carbon nanotube columns can be obtained at step 102. In some embodiments, the columns can be like columns 214 shown in FIG. 2A. As mentioned, each column 214 can comprise a plurality of bundled carbon nanotubes 216. Although three such carbon nanotubes 216 are shown in each column 214 in FIG. 2A, each column 214 can include many more (e.g., tens, hundreds, or thousands) of individual carbon nanotubes 216. Although three carbon nanotube columns 214 are shown in FIG. 2A, more or fewer can be obtained at step 102 of the process 100 of FIG. 1. The carbon nanotubes columns 214 can be grown from surfaces 222 of a growth material 226 on a growth substrate 224 as generally illustrated in FIG. 2A. Because the growth material 226 is on the growth substrate 224, it can be said that the carbon nanotube columns 214 are grown on the growth substrate 224 even though the carbon nanotube columns 214 grow directly on the surfaces 222. Examples of growing the columns 214 will be discussed below with regard to FIG. 3.

In some embodiments, the columns 214 can be obtained at step 102 in a pattern that corresponds to a pattern of terminals to which the columns 214 will be transferred. For example, in the example shown in FIG. 2A, the columns 214 can be obtained at step 102 coupled to growth substrate 224 in a pattern that corresponds to terminals 212 of the wiring substrate 202 to which the columns 214 will be transferred. Moreover, that pattern can correspond to terminals of an electronic device that the probes 240 comprising the terminals 214 will be used to contact. For example, as will be seen when discussing FIGS. 25 and 26 below, the columns 214 can be obtained at step 102 in a pattern that corresponds to terminals 2616 of the DUT 2618 (e.g., an electronic device to be tested) that the columns 214 will be used to contact to test the DUT 2618.

Referring again to FIG. 1, the columns 214 can be metalized at step 104. As used herein, metalizing a column 214 comprises depositing metal on at least a portion (e.g., some, almost all, or all) of at least some of the carbon nanotubes 216 that comprise the column 214. In some embodiments, a metal material 232 (e.g., gold, silver, copper, or other electrically conductive metals) can be deposited inside each column 214 on at least some of the carbon nanotubes 216 that are inside the column 214. In some embodiments, the metal material 232 can be deposited primarily on the outside of each column 214 (e.g., on at least some of the carbon nanotubes 216 that are on the outside of the column 214). In some embodiments, the metal material 232 can be deposited on the outside and on the inside of each column 214. Examples of depositing a metal 232 inside columns 214 will be discussed below with regard to FIGS. 8 and 9, and examples of depositing a metal 232 on the outside of columns 214 will be discussed below with regard to FIGS. 10A and 10B. As used herein, metalizing (or depositing metal material 232) inside a column 214 means metalizing (or depositing metal material 232) on at least a portion of at least some of the carbon nanotubes 216 that are inside the column 214, and metalizing (or depositing metal material 232 on) the outside of a column 214 means metalizing (or depositing metal material 232 on) at least a portion (e.g., some, almost all, or all) of at least some of the carbon nanotubes 216 that are on the outside of a column 214.

At step 106 of FIG. 1, the metalized carbon nanotube columns 214 can be transferred (e.g., by coupling or mounting) to electrically conductive terminals 212 of a wiring substrate 202 as shown in FIG. 2A. As discussed above, the columns 214 shown in FIG. 2A can be grown on surfaces 222 of the growth material 226 of the growth substrate 224; ends 220 of the columns 214 can thus be initially coupled to the surfaces 222 as a result of the growth process. As illustrated in FIGS. 2A and 2B, ends 218 of the columns 214 can be coupled by a coupling 230 to terminals 212 of the wiring substrate 202, and the ends 220 of the columns 214 can be separated (e.g., by mechanical or chemical means) from the surfaces 222 of the growth material 226. Examples of transferring the columns 214 from the growth substrate 224 to a wiring substrate 202 will be discussed below with regard to FIGS. 11-19. Either the ends 218 or the ends 220 can be deemed first ends, and the other of ends 218 or ends 220 can be deemed second opposite ends.

The wiring substrate 202 can be any substrate comprising terminals 212. For example, the wiring substrate 202 can be a printed circuit board, a ceramic substrate, or other such substrate suitable for supporting terminals 212. It is sufficient that the wiring substrate 202 alone or in combination with other components provide sufficient mechanical support for using the columns 214 to effect pressure based electrical connections with electronic devices (not shown). In some embodiments, the wiring substrate 202 can be thought of as rigid as opposed to flexible. As shown in FIG. 2A, the terminals 212 can be electrically connected by electrical connections 210 (e.g., electrically conductive vias and/or traces) in and/or on the wiring substrate 202 to other terminals 208. As illustrated in FIG. 2B, terminals 208 on a first side 204 of the wiring substrate 202 can be at a different pitch than terminals 212 on a second side 206 of the wiring substrate 202. As shown in FIG. 2B, the pitch of the terminals 208 can be larger than the pitch of the terminals 212.

At step 108 of FIG. 1, contact tips 228 (which can be electrically conductive) can be provided at ends 220 of the carbon nanotube columns 214 as shown in FIG. 2A. For example, contact tips 228 can be formed on or coupled to ends 220 of the columns 214 as illustrated in FIGS. 2A and 2B. Examples of providing contact tips 228 at ends 220 of columns 214 will be discussed below with regard to FIGS. 21A-25. In some embodiments, contact tips 228 need not be included.

At step 110 of FIG. 1, the wiring substrate 202 to which the columns 214 were transferred at step 106 can be coupled to one or more additional elements to make a electronic apparatus in which the columns 214 can be electrical probes. FIGS. 2A and 2B illustrate an example in which the wiring substrate 202 is coupled to electronic component 236 to form electronic apparatus 234. Although FIG. 2B illustrates one way of coupling the wiring substrate 202 to the electronic component 236, other ways of coupling are contemplated. Electrically conductive contact probes 240 of the electronic apparatus 234 can comprise the columns 214 as shown in FIG. 2B. Examples will be discussed below with regard to FIG. 26.

Having provided an overview of the process 100 of FIG. 1, examples for implementing each of the steps of the process 100 will now be discussed with respect to FIGS. 3-24.

As mentioned above, the carbon nanotube columns 214 can be obtained at step 102 of FIG. 1 by growing the columns 214 on the surfaces 222 of growth material 226 on a growth substrate 224. FIG. 3 illustrates a growth system 300 in which carbon nanotube columns 214 can be grown. Although for convenience and ease of discussion the growth system 300 is discussed below with regard to growing columns 214 on the surfaces 222 of the growth material 226 of the growth substrate 224, the growth system 300 is not so limited but can be used to grow other carbon nanotube columns on other growth substrates.

As shown in FIG. 3, the growth system 300 can comprise a chamber 306 in which the growth substrate 224 can be placed (initially without columns 214). As shown, a temperature control device 302 (e.g., a heater and/or cooling device) can be provided for controlling the temperature ($T_f$) of the chamber 306. As also shown, one or more inlet tubes 308, 316 can be provided into the chamber 306, and one or more outlet tubes 312 can be provided out of the chamber 306. (Although two inlet tubes 308, 316 are shown and one outlet tube 312 is shown, more or fewer inlet tubes and/or more outlet tubes 312 can alternatively be provided.) In some embodiments, an end 314 of inlet tube 316 can be positioned inside the chamber 306 a length L from an edge 304 of the temperature control device 302 as shown in FIG. 3.

An injection device 322 (e.g., a syringe or pump) can be provided to introduce a growth solution 326 into a carrier gas 324 near the input to or inside an evaporator 318, which can vaporize the growth solution 326 to enhance mixing with the carrier gas 324. From the evaporator 318, the mixture 320 of the growth solution 326 and the carrier gas 324 can be passed through the inlet tube 316 into the chamber 306 as shown. The mixture of the growth solution 326 and the carrier gas 324 can be referred to as a growth gas 320. As also shown, in some embodiments, another carrier gas 310 can be provided through another inlet tube 308 into the chamber 302. The other carrier gas 310 can be the same as or different than the carrier gas 324. One or more pumps (not shown) can be provided to pump the gases 324 and 310.

The growth system 300 can be used as follows. Initially, the growth substrate 224 can be prepared. The growth substrate 224 can be any structure suitable for supporting the columns 214 as the columns 214 grow. Non-limiting examples of a suitable growth substrate 224 include a semiconductor wafer, a ceramic substrate, a substrate comprising an organic material, a substrate comprising an inorganic material, or any combinations thereof. Growth material 226 can be deposited on the substrate 224 in locations where it is desired that carbon nanotube columns 214 are grown. Each deposit of growth material 226 can be patterned in a desired cross-sectional shape of a carbon nanotube column 214. The growth material 226 can be patterned in any suitable manner. For example, the growth material 226 can be deposited on the substrate 224 in the desired pattern of the growth material 226. Alternatively, the growth material 226 can be deposited on the substrate 224 and then portions of the growth material 226 can be selectively removed, leaving growth material 226 on the substrate 224 in the desired pattern. As yet another alternative, the growth material 226 can be deposited on the substrate 224 and then portions of the growth material 226 can be selectively covered, leaving growth material 226 on the substrate 224 exposed in the desired pattern. As still another alternative, the growth material 226 can be deposited on the substrate 224, then portions of the growth material 226 can be covered, and then portions of the covering can be selectively removed, leaving growth material 226 on the substrate 224 exposed in the desired pattern.

The pattern of the growth material 226—or more specifically, the pattern of the growth surfaces 222—can correspond to a desired pattern of the columns. As discussed above, the columns 214 can be obtained at step 102 of the process 100 of FIG. 1 in a pattern that corresponds to a pattern of terminals to which the columns 214 will be transferred. For example, in the example shown in FIG. 2A, the pattern of the growth surfaces 226—and thus the pattern of columns 214 that will be grown on the surfaces 226—can correspond to terminals 212 of the wiring substrate 202 to which the columns 214 will be transferred (see FIG. 2). As also discussed above, that pattern can correspond to terminals of an electronic device that the probes 240 comprising the terminals 214 will be used to contact. For example, as will be seen when discussing FIGS. 25 and 26 below, the pattern of the growth surfaces 226—and thus the pattern of columns 214 that will be grown on the surfaces 226—can correspond to terminals 2616 of the DUT 2618 (e.g., an electronic device to be tested) that the columns 214 will be used to contact to test the DUT 2618. The foregoing are examples of ways in which the columns 214 can be obtained (e.g., grown) in a pattern that corresponds either to terminals of an electronic device to which the columns 214 are to be transferred and/or a pattern that corresponds to terminals of an electronic device to be contacted by the columns 214, for example, to establish electrical connections with the electronic device to test the electronic device.

The growth material 226 can be any material with a surface 222 that comprises or can be formed to comprise a material on which carbon nanotubes can be grown when exposed to the growth solution 326. For example, the growth material 226 can comprise silicon, and the surfaces 222 of the growth material 226 can comprise an oxide film. In some embodiments, the growth substrate 224 or at least an upper surface of the growth substrate 224 can comprise growth material like growth material 224 with a growth surface like growth surface 222 in which case growth material 224 need not be disposed on the growth substrate 224. In such a case, the growth substrate 224 can be the growth material 226. After the growth substrate 224 is prepared, the growth substrate 224 (without the columns 214) can be placed into the chamber 306 as illustrated in FIG. 3.

The temperature control device 302 can be utilized to bring the chamber 306 to a desired temperature $T_f$. The growth solution 326 can be introduced into the carrier gas 324 and provided through the evaporator 318 and the inlet tube 316 into the chamber 306 as a growth gas. The evaporator 318 can be set to a desired temperature $T_e$ (e.g., sufficient to vaporize the growth solution 326). In introducing the growth solution 326 into the carrier gas 324, the carrier gas 324 can be provided at a flow rate $Q_1$, and the growth solution 326 can be provided at a pump rate $\zeta$. A carrier gas 310 can also be provided through the inlet tube 308 into the chamber 306, and the carrier gas 310 can be provided at a flow rate $Q_2$.

The material or materials of the growth solution 326 can be any material or materials suitable for growing carbon nanotubes on the surfaces 222 of the growth material 226. In some embodiments, the growth solution 326 can comprise a source of carbon and a catalyst. The catalyst can be any material that causes the carbon in the source of carbon to react with the surfaces 222 of the growth material 226 to grow carbon nanotubes 216 from the surfaces 222. A non-limiting example of a suitable catalyst is an iron metallorganic material (e.g., ferrocene). Other examples of suitable catalysts include nickel or cobalt metallorganic materials, zirconium oxide, ferroceneacetic acid, ferroceneacetonitrile, ferrocenecarboxaldehyde, ferrocenecarboxylic acid, ferrocenedicarboxaldehyde, and ferrocenedicarboxylic acid. The source of carbon can be any material that provides carbon to grow as carbon nanotubes on the surfaces 222 of the growth material 226. Non-limiting examples of a suitable source of carbon is a liquid hydrocarbon source (e.g., xylene), aromatic hydrocarbons (e.g., benzene, toluene, xylene, styrene, ethylbenzene and all alkylated benzene, cyclopentadiene), ethylene, and methane. If the catalyst or the source of carbon is a gas, the system 300 can be modified to accommodate the catalyst or source of carbon as a gas.

The material or materials of the carrier gas 324 can be any gas or gases suitable for carrying the growth solution 326 into the chamber 306. In some embodiments, the carrier gas 324 can comprise a carrier, a support gas, and air. Non-limiting examples of a suitable carrier include argon gas or nitrogen gas, and non-limiting examples of a suitable support gas include hydrogen gas ($H_2$) and water vapor. The carrier gas 310 can be the same as or different than the carrier gas 324. The foregoing materials are examples only, and other materials can comprise the growth solution 326 and the carrier gases 310 and 324.

The concentrations of the materials that comprise the growth solution 326 and the carrier gases 310 and 324, the temperatures $T_f$ and $T_e$ of the chamber 302 and the evaporator 318, respectively, the pump rate $\zeta$ of the growth solution 326, the flow rates $Q_1$ and $Q_2$ of the carrier gases 326 and 310, the length L of the end 314 of the inlet tube 316 from the edge 304 of the temperature control device 306, the time "t" over which the carbon nanotubes are grown from the surfaces 222 of the growth material 226, and other parameters can be selected as desired to grow the carbon nanotubes on the surfaces 222 of the growth material 226. By way of example but not limitation, the following are suitable values for the foregoing:

carrier gas 310 composition:
  $H_2$/argon ratio: 0 to 0.5;
carrier gas 324 composition:
  $H_2$/argon ratio: 0 to 0.5;
  air: 0-20 standard cubic centimeters per minute (sccm);
growth solution 326 concentration:
  concentration of ferrocene in xylene: 0.0004-0.05 grams per milliliter;
temperature $T_f$ of chamber 302: 700-850 degrees Celsius;
temperature $T_e$ of evaporator 318: 105-250 degrees Celsius;
pump rate $\zeta$ of the growth solution 326: 2-18 milliliters per hour (ml/h);
flow rate $Q_1$ of the carrier gas 324: 50-500 sccm;
flow rate $Q_2$ of the carrier gas 310: 0-200 sccm;
time "t" the carbon nanotubes are grown: 1-180 minutes;
length "L" from the edge 304 of the temperature control device 306 to the end 314 of the inlet tube 316: 8-26 centimeters.

All of the foregoing parameters as well as other parameters can affect the mechanical characteristics of the carbon nanotube columns 214 grown from the surfaces 222 of the growth material 226. Examples of such mechanical characteristics can include a generally repeatable elastic range (hereinafter "elastic range") and stiffness (e.g., the spring constant "k," which according to Hooke's law is –F*d, where d is a distance moved in response to a force F and * is multiplication) of the columns 214. The above-mentioned parameters can be maintained substantially consistent while growing the carbon nanotube columns 214 in order to obtain columns 214 that have substantially uniform mechanical characteristics along the length of the column 214 from end 220 to end 218 of the column 214. Alternatively, one or more of these parameters can be varied while growing the columns 214 to vary one or more of the foregoing mechanical characteristics (and/or other mechanical characteristics) of the column along the length of the column 214 from the end 220 to the end 218.

By way of example but not limitation, varying the parameters (discussed above) listed in Table 1 below while growing the columns 214 can affect a mechanical characteristic of the columns 214 directly or inversely, where:

"directly" means that an increase in the value of the parameter causes an increase in the value of the mechanical characteristic, and a decrease in the value of the parameter causes a decrease in the value of the mechanical characteristic while all other parameters are unchanged; and "indirectly" means that an increase in the value of the parameter causes a decrease in the value of the mechanical characteristic, and a decrease in the value of the parameter causes an increase in the value of the mechanical characteristic, while all other parameters are unchanged.

TABLE 1

| Parameter: | Mechanical Characteristic: | Affect On Mechanical Characteristic: |
|---|---|---|
| carrier gas 310: $H_2$/argon ratio | elastic range | indirectly |
| growth solution 326: concentration of ferrocene in xylene | stiffness elastic range | directly indirectly |
| pump rate $\zeta$ of the growth solution 326 | stiffness elastic range | indirectly directly |
| flow rate $Q_1$ of the carrier gas 324 | stiffness | indirectly |
| length "L" from the edge 304 of the temperature control device 306 to the end 314 of the inlet tube 316 | elastic range | indirectly |

FIG. 4A illustrates an example of a carbon nanotube column 214 grown in the system 300 of FIG. 3 while varying one or more of the above-identified parameters that affects the stiffness of the column 214. As shown in FIG. 4A, the column 214 includes stiff regions 402a, 402b, and 402c and soft regions 404a and 404b. Although three stiff regions 402a, 402b, and 402c and two soft regions 404a and 404b are shown, more or fewer stiff regions and/or more or less soft regions could alternatively be formed along the length of the column 214. As used herein, a soft region 404a and 404b is a region with a stiffness that is less than the stiffness of a stiff region 402a, 402b, and 402c. Similarly, a stiff region 402a, 402b, and 402c is a region with a stiffness that is greater than a soft region 404a and 404b.

The column 214 shown in FIG. 4A can be grown by initially growing the stiff region 402c with the above-discussed parameters in a first state; then changing one or more of the parameters to a second state (e.g., increasing the flow rate $Q_1$ of the carrier gas 324; and/or increasing the pump rate $\zeta$ of the growth solution 326; and/or decreasing the concentration of the ferrocene in the growth solution 326 if a mechanism is provided in the system 300 of FIG. 3 for varying the concentration of the catalyst in the growth solution 326 (e.g., multiple input ports through which the catalyst and the source of carbon can be separately introduced into the injection device 322)) to reduce the stiffness of the column 214 while the soft region 404b grows; then changing the one or more parameters back to their initial values while the stiff region 402b grows; then changing the one or more parameters to the second state while the soft region 404a grows; and then changing the one or more parameters to their initial states while the stiff region 402a grows. It is noted that the carbon nanotubes 216, and thus the column 214, grows from the top end 218 first. That is, the end 218 forms first on the surface 222 of the growth material 224, and column 214 grows under the end 218. Thus, as an example, the column 214 shown in FIG. 4A grows as follows: the stiff region 402c grows from the surface 222 first; the soft region 404b then grows from the surface 222 under the stiff region 402c; the stiff region 402b then grows from the surface 222 under the soft region 404b; the soft region 404a then grows from the surface 222 under the stiff region 402b; and the stiff region 402a then grows from the surface 222 under the soft region 404a. By appropriately timing the changes in the one or more parameters that affects the stiffness of the column 214, the size and locations of the stiff regions 402a, 402b, and 402c and the soft regions 404a and 404b can be selected. For example, the stiff regions 402a, 402b, and 402c and the soft regions 404a and 404b can be located in predetermined locations along the length of the column 214 from end 220 to end 218.

Figure 4B:
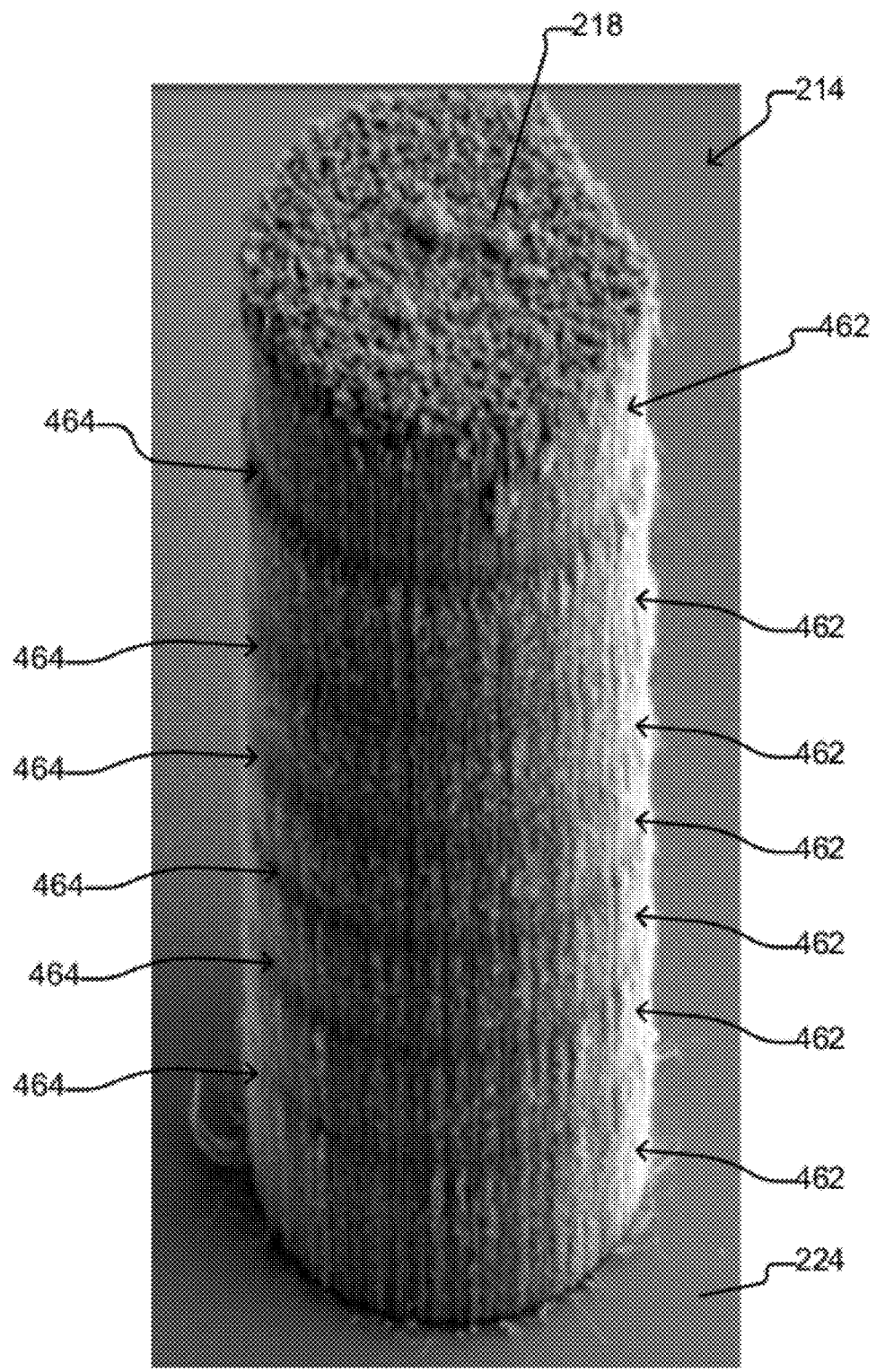
FIG. 4B shows a photograph of an example of a carbon nanotube column with soft regions according to some embodiments of the invention.

FIG. 4B illustrates a photograph of an example of a carbon nanotube column 214 with alternating stiff regions 462 and soft regions 464 on a substrate 224. As can be seen in FIG. 4B, the soft regions 464 can appear as dark rings. The stiff regions 462 can be examples of the stiff regions 402a, 402b, and 402c of FIG. 4A, and the soft regions 464 can be examples of the soft regions 404a and 404b of FIG. 4A. There can be, of course, more or fewer stiff regions 462 and/or more or fewer soft regions 464 than are shown in FIG. 4B.

FIG. 4C illustrates the column 214 of FIG. 4A after the column is transferred to the wiring substrate 202 (as discussed above). As shown in FIG. 4C, application of a force F to the end 220 of the column can cause the soft regions 404a and 404b to buckle. This can be because the soft regions 404a and 404b are less stiff than the stiff regions 402a, 402b, and 402c. The reaction of the column 214 to a force F on the end 220—and thus mechanical properties of the column 214 (e.g., the stiffness, elastic range, and/or other mechanical characteristics of the column 214)—can thus be customized by selective formation of one or more soft regions 404a and/or 404b along the length of the column 214.

Figure 6:
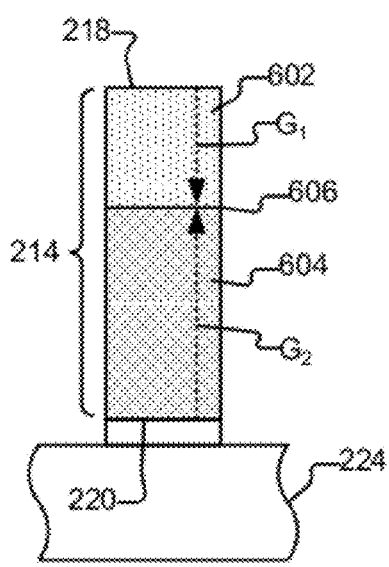
FIG. 6 illustrates an example in which a carbon nanotube column is grown while varying one or more of the parameters of the system of FIG. 3 such that the stiffness of the column varies along multiple regions of the column according to some embodiments of the invention.
Figure 7:
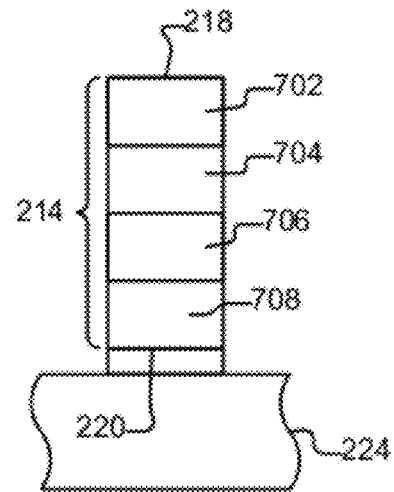
FIG. 7 illustrates an example in which a carbon nanotube column is grown while varying one or more of the parameters of the system of FIG. 3 such that the carbon nanotube column comprises a plurality of regions with different stiffness according to some embodiments of the invention.

In the example shown in FIG. 4A, the one or more parameters that affect stiffness of the column 214 were described as being changed between two states so that the stiff regions 402a, 402b, and 402c have substantially the same stiffness and the soft regions 404a and 404b have substantially the same stiffness (which is less than the stiffness of the stiff regions 402a, 402b, and 402c). This, however, is merely an example, and many variations are possible. FIGS. 5-7 illustrate non-limiting examples of such variations.

Figure 5A:
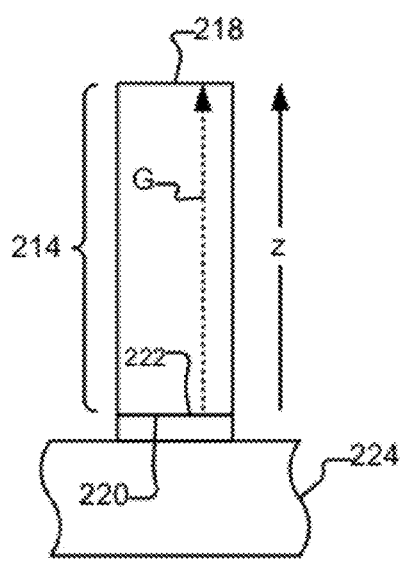
FIG. 5A illustrates an example in which a carbon nanotube column is grown while varying one or more of the parameters of the system of FIG. 3 such that the stiffness of the column varies along the column according to some embodiments of the invention.
Figure 5B:
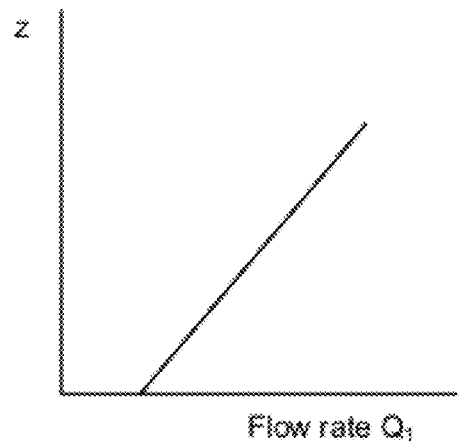
FIG. 5B shows a graph illustrating an example in which a growth parameter is increased as the column grows according to some embodiments of the invention.

In FIG. 5A, the one or more parameters that affect stiffness can start at an initial value or value and gradually be changed as the column 214 grows to increase or decrease (as desired) the stiffness of the column 214 from the end 220 to the end 218. The column 214 can thus have a stiffness gradient G that increases or decreases along the length of the column 214 from the end 220 to the end 218. For example, to grow the column 214 with a stiffness gradient G that increases in stiffness from end 220 to end 218, one or more of the following parameters can be changed as follows while the column 214 grows: gradually increasing the flow rate $Q_1$ of the carrier gas 324; and/or gradually increasing the pump rate $\zeta$ of the growth solution 326; and/or gradually decreasing the concentration of the ferrocene in the growth solution 326 if a mechanism is provided in the system 300 of FIG. 3 for varying the concentration of the catalyst in the growth solution 326 (e.g., multiple input ports through which the catalyst and the source of carbon can be separately introduced into the injection device 322). The value of the stiffness of the column 214 at the end 218 can be made a desired value by selection of the initial values of the one or more parameters varied to change the stiffness of the column 214 as the column grows. The rate of change of the stiffness along the length of the column 214 and the value of the stiffness of the column at the end 220 can similarly be made desired values by selection of the rate of change of and the final values of the or more parameters varied to change the stiffness of the column 214 as the column grows. FIG. 5B shows an example in which the flow rate $Q_1$ is increased over time as the column 214 grows, which effectively means that the flow rate $Q_1$ increases as a function of the growth location "z" (that is, the location of the end 218 as the column 214 grows from the surface 222), which results in an increasing stiffness gradient G along the length of the column 214 as shown in FIG. 5A.

FIG. 6 illustrates a variation of the column 214 of FIG. 5A. The column 214 of FIG. 6 includes two regions 602 and 604. Region 604 has a stiffness gradient $G_2$ that increases from the end 220 to a junction 606 with the region 602. Region 602 has a stiffness gradient $G_1$ that decreases from the junction 606 to the end 218 of the column 214. For example, to grow the column 214 of FIG. 6, one or more of the following parameters can be changed as follows: the flow rate $Q_1$ of the carrier gas 324 and/or the pump rate $\zeta$ of the growth solution 326 can be gradually decreased as the column 214 grows from the end 218 to the junction 606; and the flow rate $Q_1$ of the carrier gas 324 and/or the pump rate $\zeta$ of the growth solution 326 can be gradually increased as the column 214 grows from the junction 606 to the end 220. Alternatively or in addition, if a mechanism is provided in the system 300 of FIG. 3 for varying the concentration of the catalyst in the growth solution 326 (e.g., multiple input ports through which the catalyst and the source of carbon can be separately introduced into the injection device 322), the concentration of the ferrocene in the growth solution 326 can be gradually increased as the column grows from the end 218 to the junction 606, and the concentration of the ferrocene in the growth solution 326 can be gradually decreased as the column 214 grows from the junction 606 to the end 220. Although two regions 602 and 604 each with different stiffness gradients are shown in FIG. 6, the column 214 can have more than two such regions.

FIG. 7 illustrates yet another example of a variation of the column 214 shown in FIG. 4A. The column 214 of FIG. 7 includes regions 702, 704, 706, and 708 at least three of which can have different stiffness values. In fact, each of the regions 702, 704, 706, and 708 can have a different stiffness. For example, the column 214 shown in FIG. 7 can be grown by initially growing the region 702 with the flow rate $Q_1$ of the carrier gas 324 and/or the pump rate $\zeta$ of the growth solution 326 and/or the concentration of the ferrocene in the growth solution 326 having values that produce a desired stiffness of the region 702; then changing at least one of the flow rate $Q_1$ of the carrier gas 324 and/or the pump rate $\zeta$ of the growth solution 326 and/or the concentration of the ferrocene in the growth solution 326 (if a mechanism is provided in the system 300 of FIG. 3 for varying the concentration of the catalyst in the growth solution 326 (e.g., multiple input ports through which the catalyst and the source of carbon can be separately introduced into the injection device 322)) to values that produce a desired stiffness of the region 704 (which can be different than the stiffness of the region 702); then changing at least one of the flow rate $Q_1$ of the carrier gas 324 and/or the pump rate $\zeta$ of the growth solution 326 and/or the concentration of the ferrocene in the growth solution 326 (if a mechanism is provided in the system 300 of FIG. 3 for varying the concentration of the catalyst in the growth solution 326 (e.g., multiple input ports through which the catalyst and the source of carbon can be separately introduced into the injection device 322)) to values that produce a desired stiffness of the region 706 (which can be different than the stiffness of the region 702 and the region 704); and then changing at least one of the flow rate $Q_1$ of the carrier gas 324 and/or the pump rate $\zeta$ of the growth solution 326 and/or the concentration of the ferrocene in the growth solution 326 (if a mechanism is provided in the system 300 of FIG. 3 for varying the concentration of the catalyst in the growth solution 326 (e.g., multiple input ports through which the catalyst and the source of carbon can be separately introduced into the injection device 322)) to values that produce a desired stiffness of the region 708 (which can be different than the stiffness of the region 702, the region 704, and the region 706). Although four different regions 702, 704, 706, and 708 are shown in FIG. 7, there can be more or fewer of such regions some or all of which can have different stiffness values.

The examples shown in FIGS. 4A and 5-7 are not exhaustive or limiting; many variations are possible. For example, although the mechanical property stiffness is varied in the examples of FIGS. 4A and 5-7, other mechanical properties of the column 214 can be varied while the column 214 grows by varying one or more of the parameters of Table 1 above that affect other mechanical properties. For example, the elastic range of the column 214 can be varied (rather than or in addition to the stiffness of the column 214) by varying one or more of the parameters that affect the elastic range (e.g., the ratio of argon/$H_2$ in the carrier gas 310, the concentration of ferrocene in the growth solution 326, the pump rate $\zeta$ of the growth solution 326, or the length L from the edge 304 of the temperature control device 306 to the end 314 of the inlet tube 316). For example, the regions 402a, 402b, and 403 in FIG. 4A can have a different elastic range compared to the regions 404a and 404b. Similarly, the gradient G of the column 214 of FIG. 5A and/or the gradients $G_1$ and $G_2$ of the regions 602 and 604 of the column 214 of FIG. 6 can have varying elastic range values rather than or in addition to varying stiffness values. Likewise, the regions 702, 704, 706, and 708 of the column 214 of FIG. 7 can have different elastic range values rather than or in addition to having different stiffness values. Similarly, the regions 802, 804, 806, and 808 of the column 214 of FIG. 8 can have different elastic range values rather than or in addition to having different stiffness values.

Referring again to the process 100 of FIG. 1, carbon nanotube columns 214 can be provided at 102 by growing columns 214 as discussed above with one or more of FIGS. 3-7. Moreover, the columns 214 can be grown to have varying mechanical characteristics such as varying stiffness values as illustrated in the examples shown in FIGS. 4A and 5-7. Alternatively, the columns 214 can be obtained in other ways. For example, the growth substrate 224 can be obtained with the columns 214 already grown from the growth material 226.

Regardless of how the columns 214 are obtained at step 102, the carbon nanotube columns 214 can be metalized at step 104. Alternatively, the columns 214 can be metalized after transferring the columns at step 106. Regardless of when the columns 214 are metalized, the columns 214 can be metalized, for example, to increase the conductivity and/or the current carrying capability of the columns 214. For example, the columns 214 can be metalized to increase the electrical conductivity and/or the current carrying capability of the columns 214 sufficiently for the columns 214 to be used to establish pressure based electrical contacts with an electronic device (e.g., a semiconductor die) to be tested. Metalizing the carbon nanotube columns 214 can include depositing metal 232 inside the columns 214 on at least some of the carbon nanotubes 216 inside the columns 214 and/or depositing metal 232 on the outside of the columns 214 on at least some of the carbon nanotubes 216 at the outside of the columns 214. Any suitable method of depositing the metal 232 can be used. For example, the metal 232 can be deposited onto the columns 214 by sputtering, chemical vapor deposition, electroless plating, electroplating, or other similar deposition methods. As discussed above, depositing metal onto a column 214 means depositing metal onto at least a portion of at least some of the carbon nanotubes 216 that form the column 214. In some embodiments, some, almost all, or all of the carbon nanotube 216 can be metalized.

Figure 8:
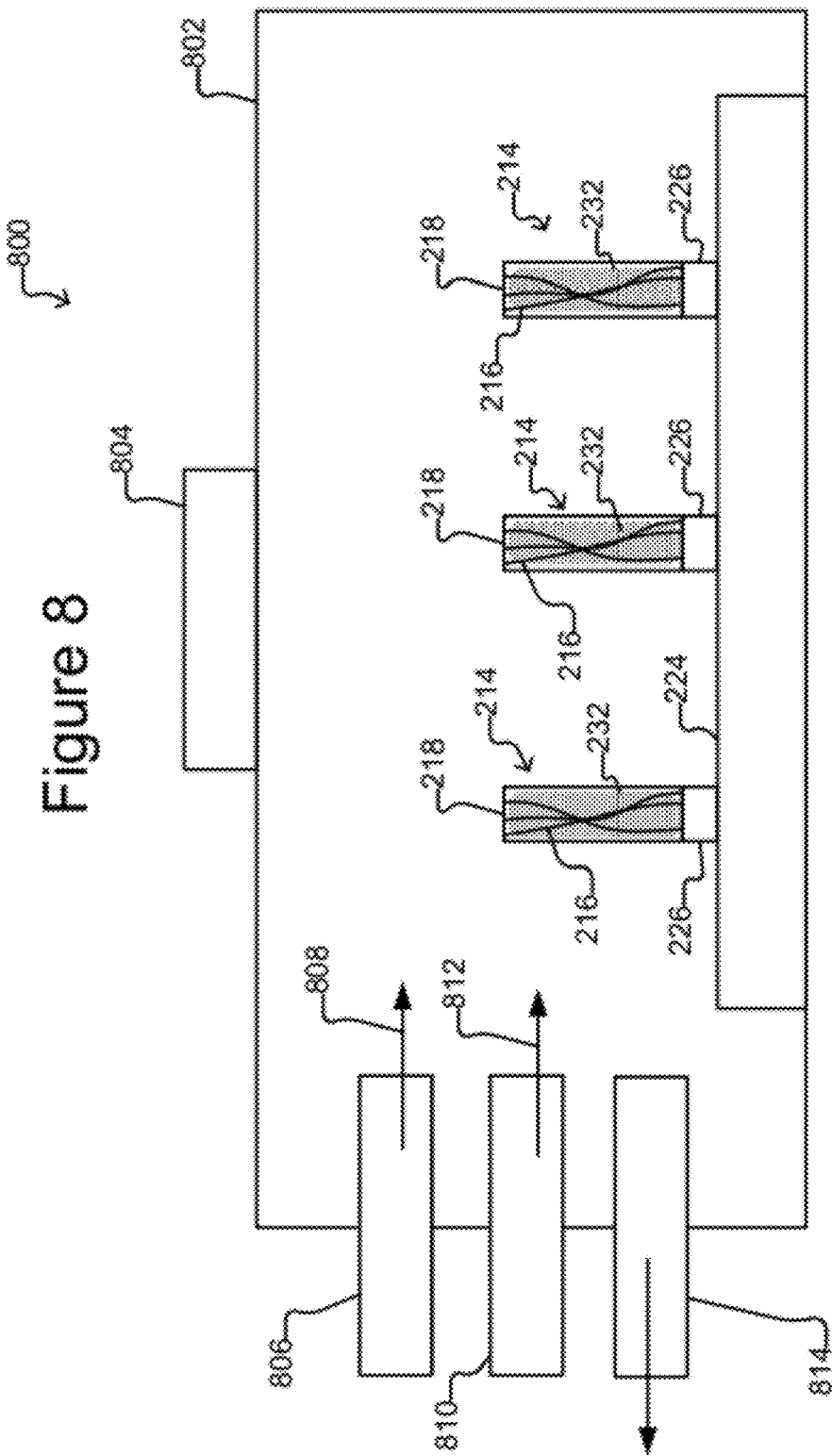
FIG. 8 illustrates an example of a system for metalizing carbon nanotube columns according to some embodiments of the invention.

Methods that deposit the metal 232 on carbon nanotubes 216 inside the column can be advantageous in certain embodiments, although the invention is not so limited. FIG. 8 illustrates a metalizing system 800, and FIG. 9 illustrates a process of utilizing the system 800 to metalize the columns 214 obtained at step 102 of FIG. 1 in which metal 232 can be deposited on carbon nanotubes 216 inside the columns 214.

As shown in FIG. 8, the metalizing system 800 can comprise a chamber 802 and a temperature control device 804 (e.g., and heater and/or cooling device) that can control the temperature inside the chamber 802. The temperature control device 804 can comprise an inductive heater, and the chamber can be non-electrically conductive. For example, the chamber 802 can comprise glass plates. One or more inlet ports 806 and 810 (two are shown but fewer or more can be included) can provide means by which materials (e.g., gases 808 and 812) can be introduced into the chamber 802. The system 800 can also include a vacuum pump 814 by which the chamber 802 can be evacuated.

Figure 9:
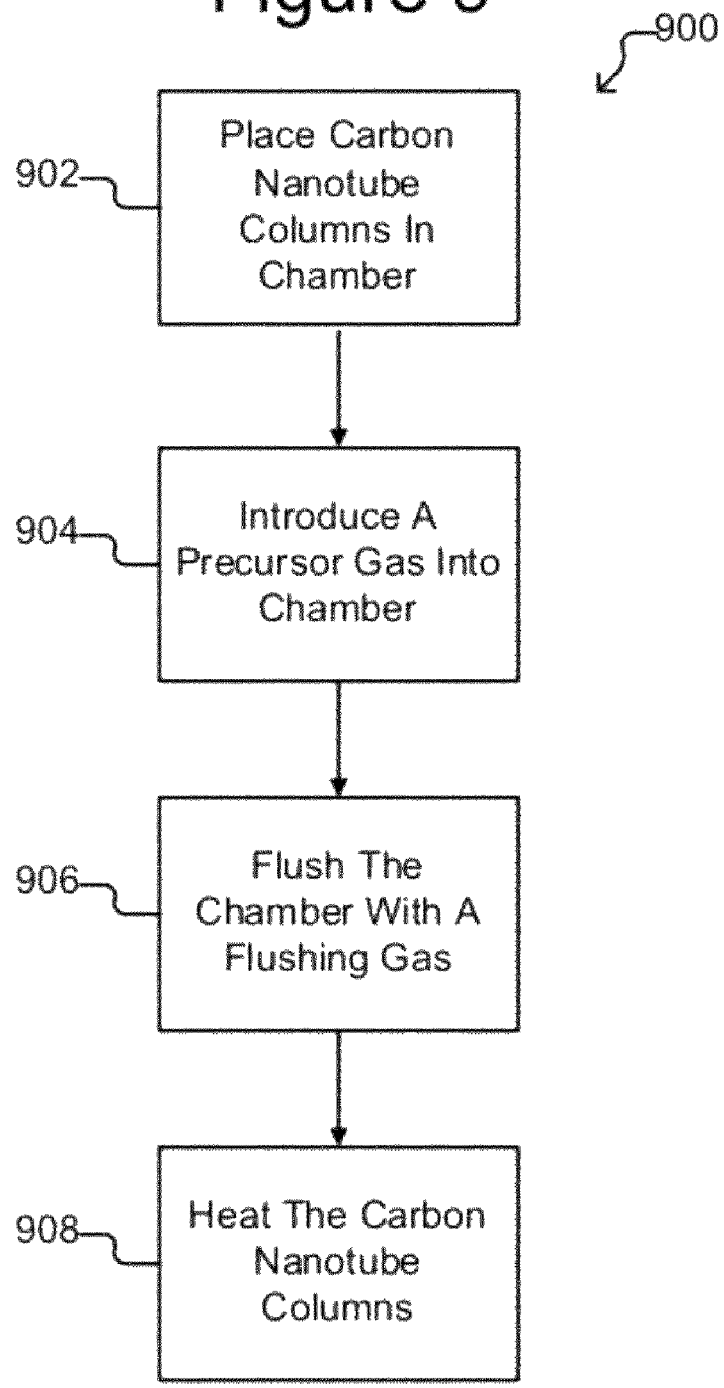
FIG. 9 illustrates an example of a process for metalizing carbon nanotube columns according to some embodiments of the invention.

Per step 902 of FIG. 9, the system 800 of FIG. 8 can be used to metalize the carbon nanotube columns 214 by initially placing the growth substrate 224 into the chamber 802 as shown in FIG. 8. At step 904 of FIG. 9, a precursor gas 808 can be introduced through the inlet port 806 into the chamber 802 as shown in FIG. 8. The precursor gas 808 can comprise the metal 232 that is to be deposited on the carbon nanotubes 216 inside the columns 214. In some embodiments, the precursor gas 808 can comprise a chemical vapor deposition gas (CVD) and a metal (e.g., gold, silver, platinum, copper, palladium, tungsten, or similar metals). For example, the precursor gas 808 and metal can comprise any of the following available from Strem Chemicals, Inc. of Newburyport, Mass.: dimethyl(acetylacetonate) gold (III), dimethyl(trifluoroacetylacetonate) gold (III), chloro(trimethylphosphine) gold, chloro(triethylphosphine) gold, trimethyl(trimethylphosphine) gold, or methyl(trimethylphosphine) gold. The precursor gas 808 can be introduced into the chamber 802 under sufficient pressure to cause the precursor gas 808 to penetrate the columns 214 and thus enter the columns 214. One non-limiting way of doing so is as follows: evacuate the chamber 802 using the vacuum pump 814, and introduce the precursor gas 808 through the inlet port 806 under a pressure that is between just above atmospheric pressure to about ten times atmospheric pressure. The foregoing pressure range is an example only, and the invention is not so limited. In addition to inductive heating, radiant heating using flash lamps or other technology developed for rapid thermal processing of semiconductor wafers can also be used.

At step 906 of FIG. 9, the chamber 802 can flushed with a flushing gas. For example, a flushing gas 812 can be introduced into the chamber 802 through the inlet port 810 and removed from the chamber 802 by the vacuum pump 814. The flushing gas 812 can be a gas that does not react appreciably with the carbon nanotubes 216 of the columns 214. Examples of a suitable flushing gas 812 can include nitrogen ($N_2$).

The flushing gas 812 can be introduced into the chamber 802 and removed from the chamber 802 by the vacuum pump 814 at a rate that is sufficiently less than the diffusion speed of the precursor gas 808 that some of the precursor gas 808 remains inside the columns 214 around the carbon nanotubes 216. That is, the flushing gas 812 can be introduced into the chamber 802 to flush the precursor gas 808 in the chamber out of the chamber 802 while leaving a desired amount of the precursor gas 808 inside the columns 214 around carbon nanotubes 216 inside the columns 214 and, optionally, some of the precursor gas 808 in the chamber 802 around the outside of the columns 214. The amount of the precursor gas 808 left inside the columns 214 and in the chamber 802 around the columns 214 (and thus outside the columns 214) can be controlled by controlling the rate of introduction of the flushing gas 812 into and out of the chamber 802 in comparison to the rate of diffusion of the precursor gas 808 and the start of step 908 (discussed below). As will be seen, the amount of precursor gas 808 left inside the columns 214 can correspond to the amount of the metal 232 that will deposit inside the columns 214 (that is, on carbon nanotubes 216 inside the columns 214), and the amount of precursor gas 808 left in the chamber 802 around the outside of the columns 214 can correspond to the amount of the metal 232 that will deposit on the outside of the columns 214 (that is, on carbon nanotubes 216 at the outside of the columns 214).

At step 908 of FIG. 1, the temperature control device 804 can be activated to bring the temperature of the carbon nanotube columns 214 to a temperature that causes the metal 232 in the precursor gas 808 inside the columns 214 to deposit onto carbon nanotubes 216 inside the columns 214 and the metal 232 in the precursor gas 808 outside the columns 214 (if any) to deposit onto carbon nanotubes 216 at the outside of the columns 214. For example, the temperature of the columns 214 can be raised to or above a temperature that breaks the precursor gas 808 down, allowing the metal 232 in the precursor gas 808 inside the columns 214 to bond to carbon nanotubes 216 inside the columns 214 and the metal 232 in the precursor gas 808 outside of the columns 214 to bond to carbon nanotubes 216 at the outside of the columns 214. This temperature can depend on the type of precursor gas 808. In some embodiments, the temperature can be 200-800 degrees Celsius. As mentioned above, the timing of bringing the temperature of the carbon nanotubes columns 214 to a temperature that causes the metal 232 in the precursor gas 808 to deposit onto carbon nanotubes 216 can affect where the metal 232 deposits. For example, if the temperature of the carbon nanotubes columns 214 reaches a temperature that causes the metal 232 in the precursor gas 808 to deposit onto carbon nanotubes 216 after all or most of the precursor gas 808 has been flushed from the chamber 902—and thus little to no precursor gas 808 remains around the outside of the columns 214—but while precursor gas 808 remains inside the columns 214, the metal 232 from the precursor gas 808 will deposit substantially only on carbon nanotubes 216 that are inside the columns 214. If, however, the temperature of the carbon nanotubes columns 214 reaches a temperature that causes the metal 232 in the precursor gas 808 to deposit onto carbon nanotubes 216 before the precursor gas 808 has been completely flushed from the chamber 902—and thus while some amount of precursor gas 808 remains around the outside of the columns 214—the metal 232 from the precursor gas 808 will deposit on carbon nanotubes 216 that are both inside the columns 214 and at the outside of the columns 214. Moreover, the amount of metal 232 the deposits on carbon nanotube columns 216 inside the columns 214 with respect to the amount of metal 232 that deposits on carbon nanotube columns 216 at the outside of the columns 214 depends on the amount of precursor gas 808 inside the columns 214 and outside the columns 214, which as discussed above can be controlled by controlling the following: the rate of introduction of the flushing gas 812 into and out of the chamber 802 in comparison to the rate of diffusion of the precursor gas 808, and the timing of step 908 (that is, the timing of the temperature of the columns 214 reaching the temperature at which metal 232 in the precursor gas 808 starts to deposit on carbon nanotubes 216). As mentioned, the foregoing can be controlled and timed to control the amount of metal 232 that deposits on carbon nanotubes 216 inside the columns 214 and on carbon nanotubes 216 at the outside of the columns 214.

As mentioned, the temperature control device 804 can be inductive and can heat the columns 214 inductively. Alternatively, the temperature control device 804 can heat the interior of the chamber 802. Steps 904-908 of FIG. 9 can be repeated as desired. For example, steps 904-908 can be repeated until a desired thickness of metal 232 has been deposited on carbon nanotubes 216 inside the columns 214 and/or at the outside of the columns 214. In some embodiments, during initial iterations of steps 904-908, metal 232 can be deposited primarily or exclusively on carbon nanotubes 216 inside the columns 214, which can avoid problems arising from metal 232 deposits on carbon nanotubes 216 at the outside of the columns impeding the flow of the precursor gas 808 into the inside of the columns 214. A non-limiting advantage of the process 900 of FIG. 9 can be that an appreciable amount of the metal 232 is deposited on carbon nanotubes 216 inside the columns 214 rather than only or primarily only on carbon nanotubes 216 at the outside of the columns 214.

Figure 10A:
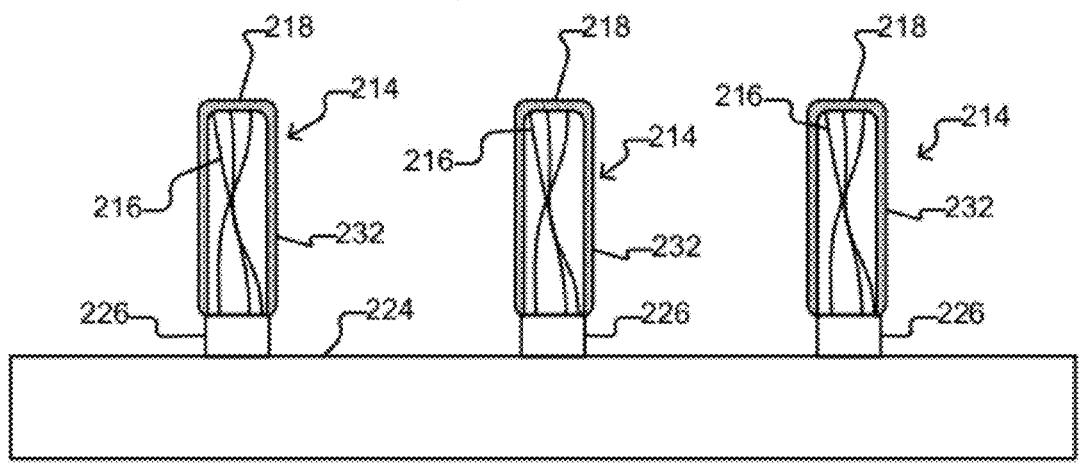
FIG. 10A illustrates metalizing outer portions of carbon nanotube columns according to some embodiments of the invention.
Figure 10B:
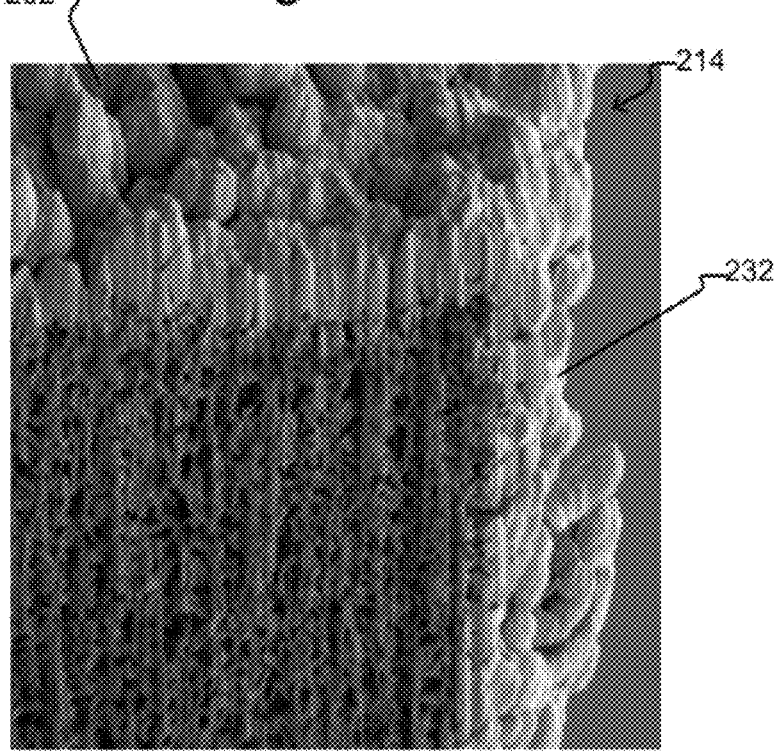
FIG. 10B shows a photograph of a portion of a carbon nanotube column sliced lengthwise to illustrate metal deposited on outer portions of the column.

Nevertheless, the metal 232 can be deposited primarily on carbon nanotubes 216 at or near the outside of the columns 214. FIG. 10A illustrates an example according to some embodiments of the invention. As shown in FIG. 10A, metal 232 can be deposited generally onto the outside of the columns 214 (that is, primarily onto carbon nanotubes 216 that are at or near the outside of the columns 214). FIG. 10B shows a photograph of a column of carbon nanotubes 214 that has been sliced to show the inside of the column 214. The metal 232 is light colored. As shown in FIG. 10B, the metal 232 is located primarily on the outside of the column 214. The darker colored interior of the column 214 indicates an absence of the metal 232 inside the column. The metal 232 can be deposited in any suitable manner. For example, the metal 232 can be deposited by sputtering. As another example, the metal 232 can be deposited by electroplating. As still further examples, atomic layer deposition (ALD) or metalorganic chemical vapor deposition (MOCVD) can also be used. In some embodiments, the various techniques for depositing metals can be used in combination (for example, a seed layer can be deposited by ALD and then followed by electroplating to form a thicker deposit).

The processes for depositing metal 232 illustrated in FIGS. 8, 9, 10A, and 10B are examples only, and variations are possible. For example, in some embodiments, the metal 232 can be deposited both inside the columns 214 (that is, on carbon nanotubes 216 inside the columns 214) as discussed above with respect to FIGS. 8 and 9, and additional metal 232 can be deposited on the outside of the columns 214 (that is, on carbon nanotubes 216 at the outside of the columns 214) as shown in FIG. 10A. Thus, regardless of how metal 232 is illustrated in a particular figure herein, in any figure herein, metal 232 can be deposited primarily on carbon nanotubes 216 inside the columns 214 as illustrated in FIG. 8 and discussed above with respect to FIGS. 8 and 9, primarily on carbon nanotubes 216 that are at the outside of the columns 214 as shown in FIGS. 10A and 10B, or both on carbon nanotubes that are inside the columns 214 and at the outside of the columns 214.

Figure 12:
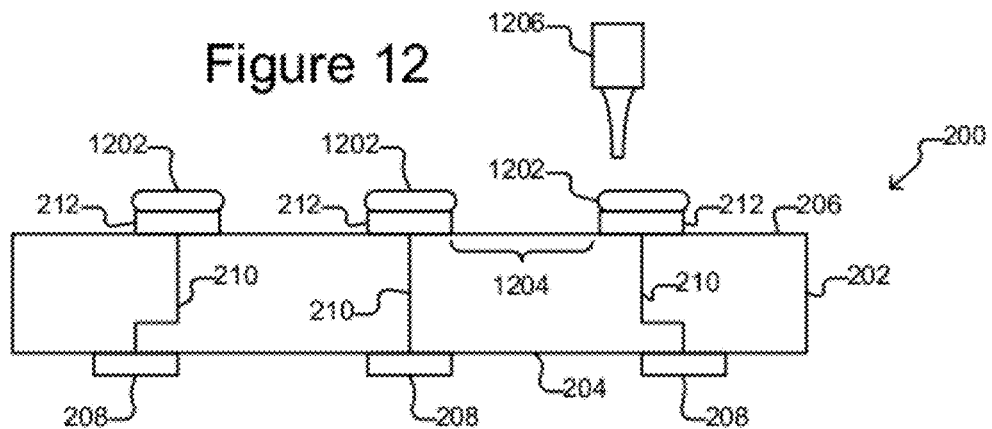
FIG. 12 illustrates an example of the depositing step in FIG. 11 according to some embodiments of the invention.
Figure 13:
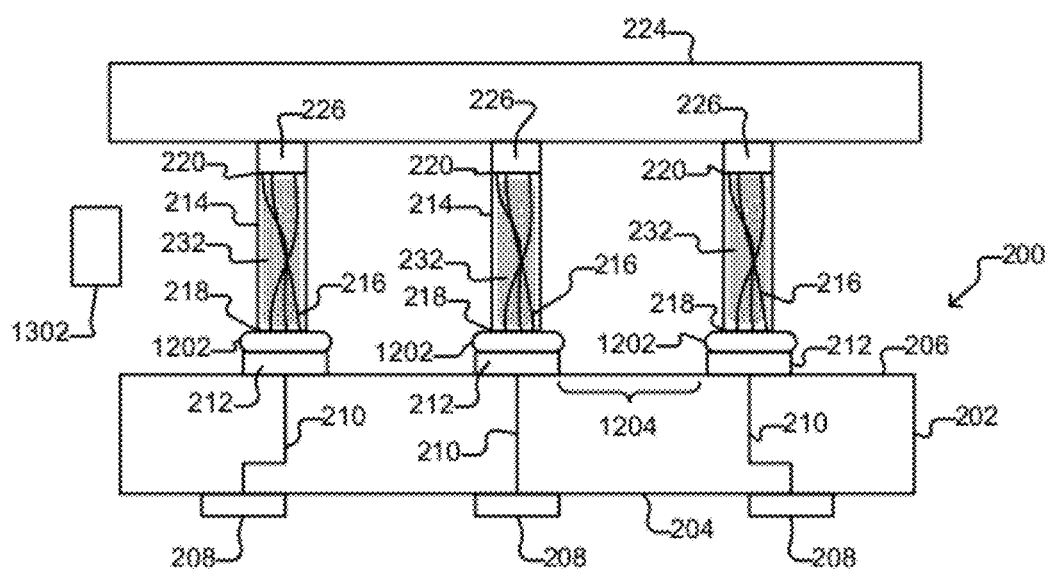
FIG. 13 illustrates an example of the positioning and sintering steps of FIG. 11 according to some embodiments of the invention.
Figure 14:
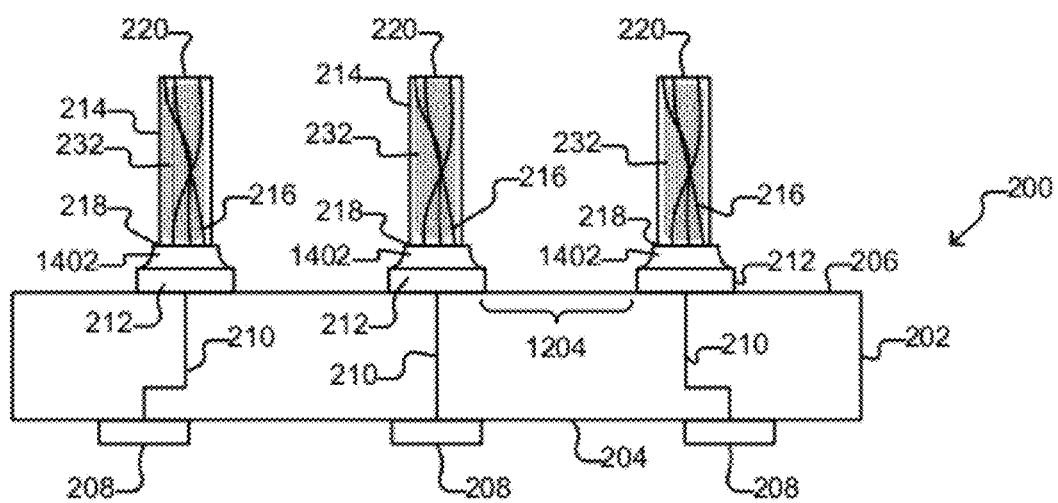
FIG. 14 illustrates an example of the releasing step of FIG. 11 according to some embodiments of the invention.
Figure 15:
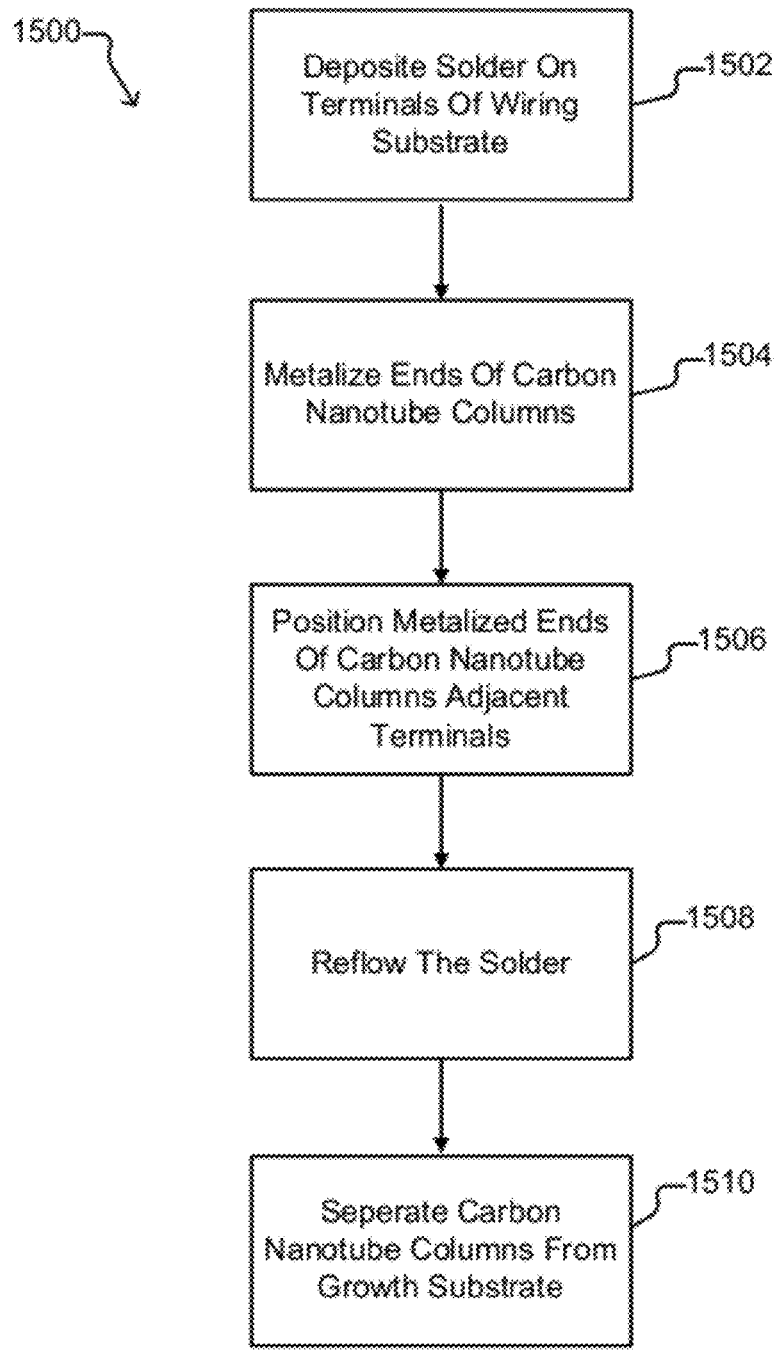
FIG. 15 illustrates another example of a process of transferring carbon nanotube columns from a growth substrate to a wiring substrate according to some embodiments of the invention.

Referring again to the process 100 of FIG. 1, after metallizing the carbon nanotube columns 214 at step 104, the columns 214 can be transferred from the growth substrate 224 to terminals 212 of a wiring substrate 202 (see FIG. 2A). FIG. 11 illustrates an example of a process 1100 in which the columns 214 can be transferred to terminals 212 of the wiring substrate 202 (which was discussed above with regard to FIGS. 2A and 2B) using a nanopaste 1202 that is sintered, and FIGS. 12-14 illustrate an example of operation of the process 1100 of FIG. 11. FIG. 15 illustrates another example of a process 1500 in which the columns 214 are transferred to the wiring substrate 202 using solder 1602 or a similar electrically conductive joining material, and FIGS. 16-19 illustrate examples of operation of the process 1500. The process 1100 of FIG. 11 is thus an example of how the step 106 of FIG. 1 can be implemented, and the process 1500 of FIG. 15 is another example of how the step 106 of FIG. 1 can be implemented.

Referring to the process 1100 of FIG. 11 and FIGS. 12-14, nanopaste 1202 comprising particles of a conductive material can be deposited on terminals 212 of the wiring substrate 202. The nanopaste 1202 can comprise particles of an electrically conductive material (e.g., gold, silver, copper, or similar metals) in a solvent. The particles can be nanoparticles. In some embodiments, the nanopaste 1202 can also include sharp particles that can penetrate a surface of the terminals 212 of the wiring substrate 202 and thus facilitate forming electrical connections with the terminals 212.

The nanopaste 1202 can be deposited onto the terminals 212 in any suitable manner. For example, as shown in FIG. 12, in some embodiments, the nanopaste 1202 can be printed through a print head 1206 (e.g., an inkjet print head) onto the terminals 212. Printing the nanopaste 1202 as shown in FIG. 12 can deposit the nanopaste 1202 precisely and on terminals 212 with a fine pitch (e.g., 150 microns or smaller). Alternatively, the nanopaste 1202 can be deposited onto the terminals 212 using other methods such as screen printing, a mask, etc.

At step 1104 of FIG. 11, ends 218 of the carbon nanotube columns 214 can be positioned adjacent the nanopaste 1202 on the terminals 212 as shown in FIG. 13. For example, the ends 218 of the columns 214 can be positioned in the nanopaste 1202. In some embodiments, the ends 218 can be pressed against the terminals 212.

At step 1106 of FIG. 11, the nanopaste 1202 can be sintered. For example, the nanopaste 1202 can be heated to a temperature (the sintering temperature) and for a time period that will evaporate the solvent and fuse the particles of conductive material in the nanopaste 1202 to the carbon nanotubes 216 of the columns 214 and the terminals 212. The sintering temperature can be less than the melting point of the material of the conductive particles of the nanopaste 1202. Generally speaking, the smaller the conductive particles in the nanopaste 1202, the lower the temperature to sinter the nanopaste 1202. The nanopaste 1202 can be heated in any suitable way including by using a temperature control device 1302 (e.g., a heating device).

In some embodiments, the sintering temperature can be less than one half of the melting point of the material of the conductive particles in the nanopaste 1202. For example, in some embodiments, the conductive particles can be gold, and the nanopaste 1202 can be heated to a sintering temperature of about 350 degrees Celsius for about two minutes. The melting point of gold is 1064 degrees Celsius. For example, in some embodiments, the conductive particles can be silver, and the nanopaste 1202 can be heated to a sintering temperature of about 200 degrees Celsius for about two minutes. The melting point of silver is 963 degrees Celsius. Regardless of the material of the nanoparticles and the sintering temperature to which the nanopaste 1202 is heated, the sintering of the nanopaste 1202 can create a fillet 1402 as shown in FIG. 14 that both physically anchors and electrically connects the carbon nanotubes 216 of a column 214 to a terminal 212 of wiring substrate 202.

At step 1108 of FIG. 11, the columns 214 can be separated from the growth substrate 224, which can then be removed. The columns 214 can be separated from the growth substrate 224 in any suitable manner, including by physically pulling the growth substrate 224 away from the columns 214, use of a solvent, etc.

Figure 16:
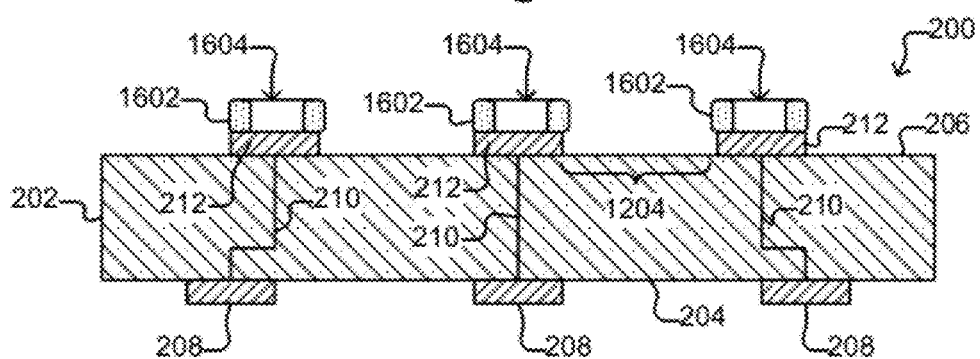
FIG. 16 illustrates an example of the depositing solder step of FIG. 15 according to some embodiments of the invention.

As mentioned above, FIG. 15 illustrates another example of a process 1500 that can be used to implement the step 106 of FIG. 1. At step 1502 of FIG. 15, solder 1602 can be deposited onto the terminals 212 of the wiring substrate 202 as shown in FIG. 16. As also shown in FIG. 16, a hole 1604 can be provided in the solder 1602. For example, the solder 1602 can be deposited in a generally donut shape on the terminals 212. Alternatively, the solder 1602 need not include holes 1604 but can comprise a dollop of solder deposited on the terminals 212. Regardless of the shape of the solder 1602, the solder 1602 can be deposited in any suitable manner. For example, the solder 1602 can deposited through a mask.

Figure 17:
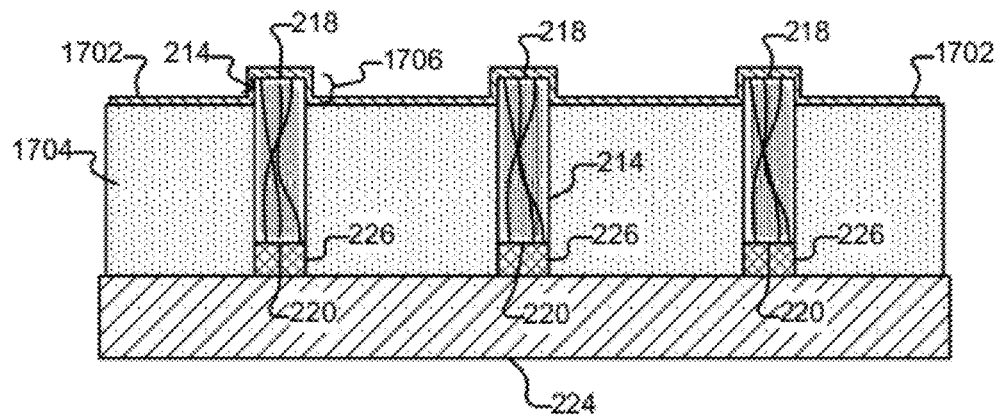
FIG. 17 illustrates an example of the metalizing step of FIG. 15 according to some embodiments of the invention.

At step 1504 of FIG. 15, end portions 1706 of the carbon nanotube columns 214 on the growth substrate 224 can be metalized or otherwise coated with a material that is wettable to solder 1602 (that is, a material to which solder 1602 will adhere). FIG. 17 illustrates an example in which end portions 1706 of the columns 214 are metalized with a metal 1702 (e.g., copper) or other material that is wettable to solder 1602. As shown in FIG. 17, a masking material 1704 can be deposited on the growth substrate 224 around the columns 214. End portions 1706 of the columns 214 can extend out of the masking material 1704. An end portion 1706 of a column 214 can be less than the entire length of the column from end 220 to end 218. For example, in some embodiments, end portion 1706 can be less than 5%, less than 10%, less than 15%, less than 20%, or less than 25% of the length of a column 214 from end 220 to end 218. In other embodiments, the end portions 1706 can be other percentages of the length of a column 214 from end 220 to end 218.

Metal 1702 can then be deposited onto the masking material 1704 and onto the exposed end portions 1706 of the columns 214 as shown in FIG. 17. As can be seen, the masking material 1704 masks most of the columns 214, preventing the metal 1702 from being deposited onto the columns 214 except for the exposed end portions 1706. The masking material 1704 as well as the portions of the metal 1702 on the masking material 1704 can be removed, leaving the metal 1702 on the end portions 1706 of the columns 214. In some embodiments, the columns 214 can be lapped or otherwise planarized while encased in the masking material 1704. The masking material 1704 can be any material suitable for deposition onto and later removal from the growth substrate 224. Non-limiting examples of the masking material 1704 include photoresist and trelibond.

Figure 18:
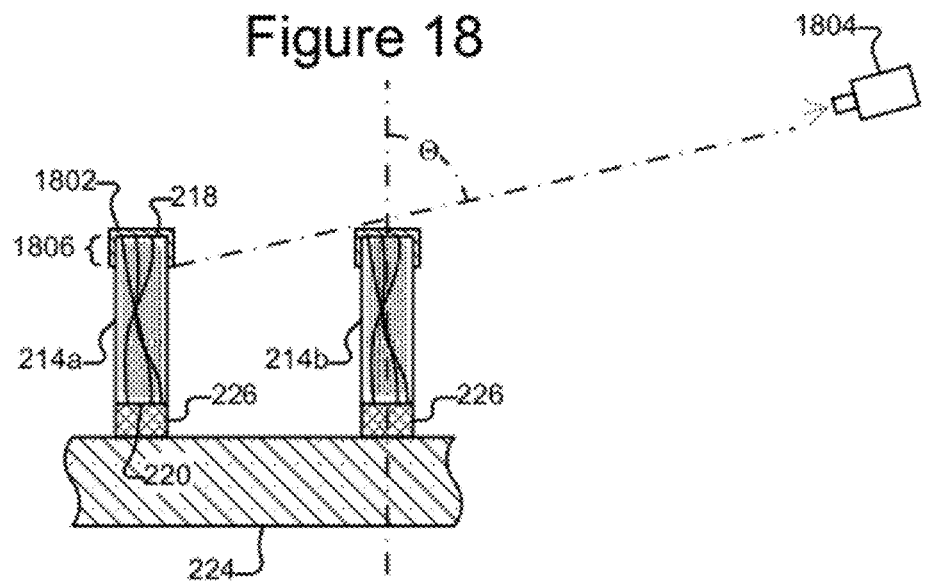
FIG. 18 illustrates another example of the metalizing step of FIG. 15 according to some embodiments of the invention.

FIG. 18 illustrates another example of metalizing the ends of the columns 214 with a metal 1802 (e.g., copper, nickel, gold, silver, and/or alloys of the foregoing) or other material that is wettable to solder. In some embodiments, a layered structure of various meals (e.g., copper, nickel, gold, silver, or alloys of the foregoing) can be the result of metalizing. In the example of FIG. 18, a sputtering apparatus 1804 can be disposed at an angle θ with respect to the columns 214 as shown (e.g., with an axis that is parallel with the lengths of the columns 214). The angle θ can be selected such that adjacent columns 214 mask each other and the metal 1802 sputtered onto the columns 214 is sputtered only onto an end portion 1806 of the columns 214. As shown in FIG. 18, column 214*b* partially masks the sputtering apparatus 1804, and metal 1802 is consequently not sputtered onto portions of the adjacent column 214*a* other than the end portion 1806. The angle θ can be selected so that an end portion 1806 of a column 214 is less than the entire length of the column from end 220 to end 218. For example, in some embodiments, end portion 1806 can be less than 5%, less than 10%, less than 15%, less than 20%, or less than 25% of the length of a column 214 from end 220 to end 218. In other embodiments, the end portions 1806 can be other percentages of the length of a column 214 from end 220 to end 218. In some embodiments, the sputtering apparatus 1804 can be moved and positioned at different angles and from different locations with respect to the growth substrate 224 and the ends 218 of the columns in order to metalize the end portions 1806 of the columns 214 on the growth substrate 224.

Figure 19:
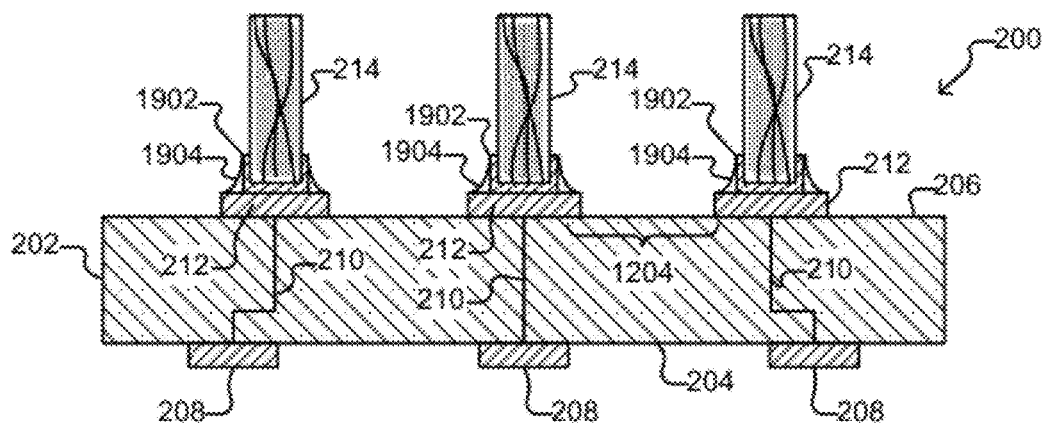
FIG. 19 illustrates an example of the positioning, reflowing, and releasing steps of FIG. 15 according to some embodiments of the invention.

Regardless of how a metal layer (e.g., 1702 in FIG. 17 or 1802 in FIG. 18) is deposited onto ends 218 of the columns 214, at step 1506 of FIG. 15, the columns 214 can be transferred to the wiring substrate 202 by positioning the metalized ends 218 of the carbon nanotube columns 214 adjacent the solder 1602 on the terminals 212 of the wiring substrate 202 as shown in FIG. 19. (In FIG. 19, label 1902 represents metal at the ends 218 of the columns 218 whether the metal was deposited as 1702 as in FIG. 17 or as 1802 as in FIG. 18. Metal 1902 in FIG. 19 thus represents metal 1702 on the end portions 1706 of the columns 214 in FIG. 17 or metal 1802 on the end portions 1806 of the columns 214 in FIG. 18.) For example, the metalized 1902 ends 218 can be positioned inside the holes 1604 in the solder 1602 (see FIG. 16). In some embodiments, the metalized 1902 ends 218 of the columns 214 can be pressed against the terminals 212.

At step 1508, the solder 1602 can be heated and reflowed, which can create a fillet 1904 of the solder 1602 as shown in FIG. 19. The fillet 1904 of solder can both physically anchor and electrically connect a column 214 to a terminal 212 of wiring substrate 202. As noted, the solder 1602 will not likely wet (adhere) to the column 214 but will likely wet only to the metal 1902 at the end 218 of the column 214.

At step 1510 of FIG. 15, the columns 214 can be separated from the growth substrate 224, which can then be removed. The columns 214 can be separated from the growth substrate 224 in any suitable manner, including by physically pulling the growth substrate 224 away from the columns 214, use of a solvent, etc.

Figure 20:
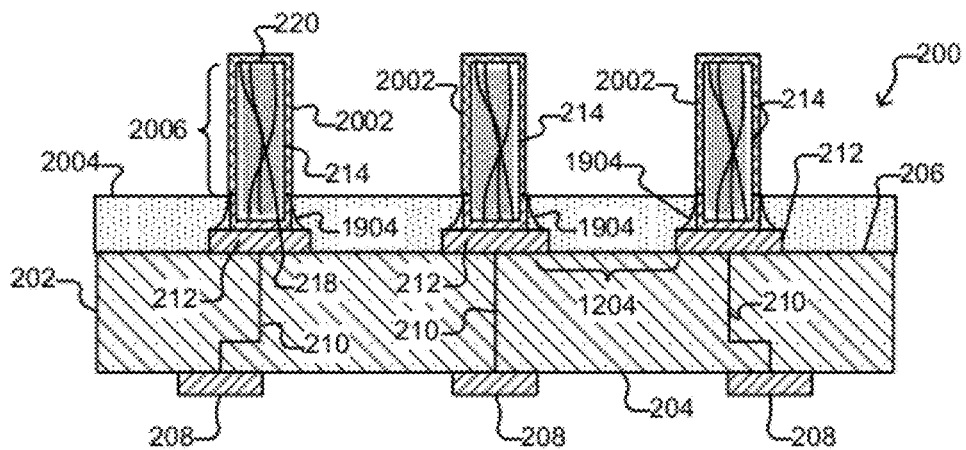
FIG. 20 illustrates an example in which a metal coating is deposited onto the carbon nanotube columns according to some embodiments of the invention.

FIG. 20 illustrates an optional process in which a metal coating 2002 can be provided on the columns 214 according to some embodiments of the invention. As shown in FIG. 20, a masking material 2004 can be deposited onto the wiring substrate 202 between the columns 214 such that a portion 2006 of the columns 214 extends out of the masking material 2004. As will be seen, the masking material 2004 masks deposition of the metal coating 2002 (e.g., gold, silver, copper, or similar metals). The portions 2006 of the columns 214 that extend out of the masking material 2004 can thus correspond to the portion of each column 214 on which it is desired to deposit the metal coating 2002. The height of the masking material 2004 on the wiring substrate 202 can be such that the length of the portions 2006 of the columns 214 that extend out of the masking material 2004 is as desired. In some embodiments, the masking material 2004 can extend to the terminals 212 so that the metal coating 2002 extends to the terminals 212. In some embodiments, the masking material 2004 can extend to the solder fillets 1904 so that the metal coating 2002 extends to the solder fillets 1904. Regardless, the masking material 2004 can be any material suitable for deposition onto and later removal from the wiring substrate 202. Non-limiting examples of the masking material 2004 include photoresist and trelibond. The metal coating 2002 can then be deposited onto the columns as shown in FIG. 20. The masking material 2004 can prevent the metal coating 2002 from depositing anywhere other than the exposed portion 2006 of the columns 2004. The metal coating 2002 can be deposited using any suitable deposition method including electroplating, electroless plating, sputtering, etc. The masking material 2004 can then be removed along with any of the metal coating 2002 that accumulated on the masking material 2004.

Figure 21A:
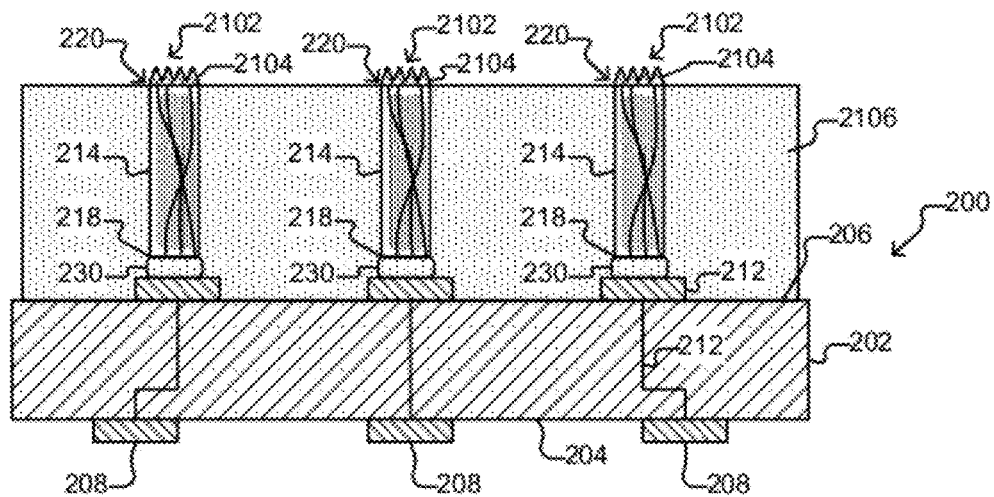
FIG. 21A illustrates an example of treating carbon nanotube columns to form contact tips at the ends of the columns according to some embodiments of the invention.
Figure 21B:
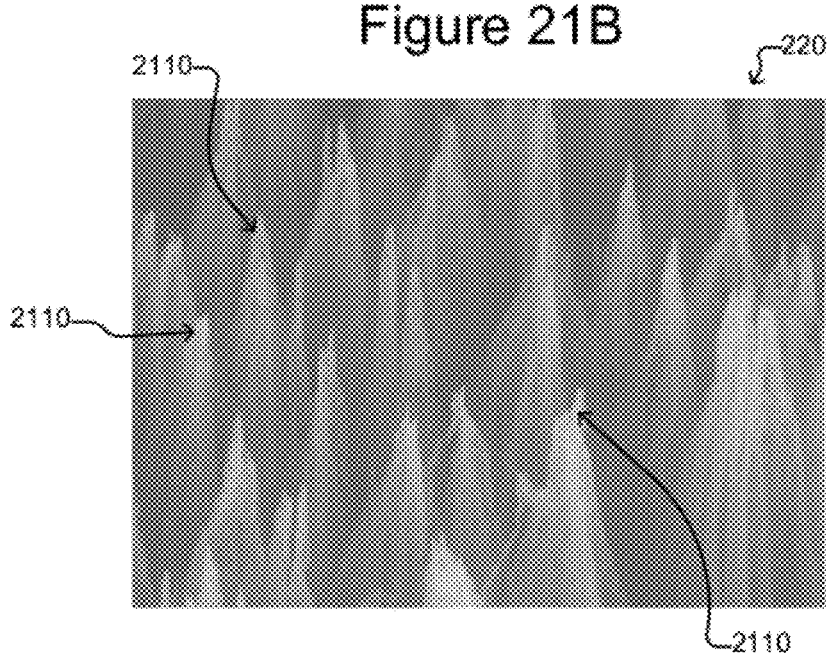
FIG. 21B shows a photograph of an end of a carbon nanotube column showing examples of sharp end structures at an end of the column according to some embodiments of the invention.
Figure 22:
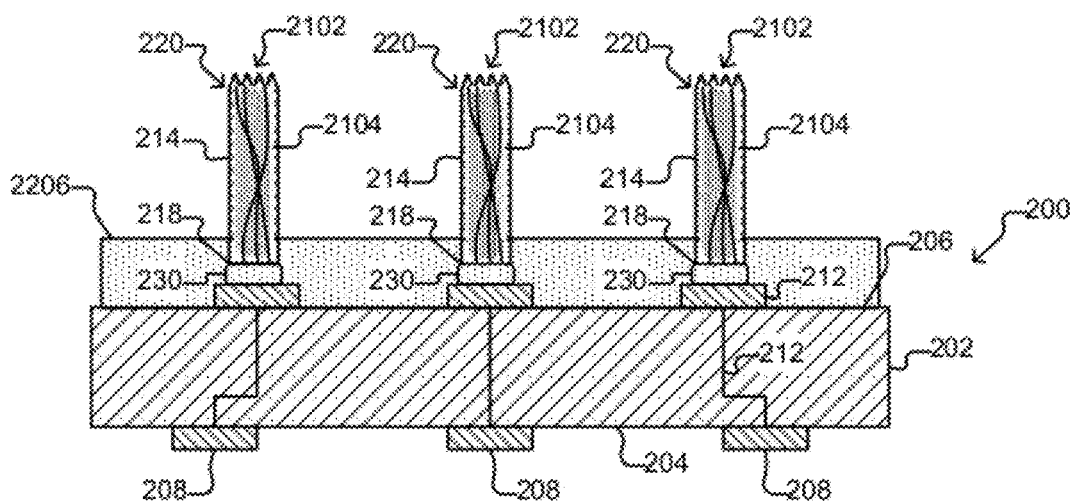
FIG. 22 illustrates an example of metalizing outer portions of at least part of the carbon nanotube columns of FIG. 21A according to some embodiments of the invention.
Figure 25A:
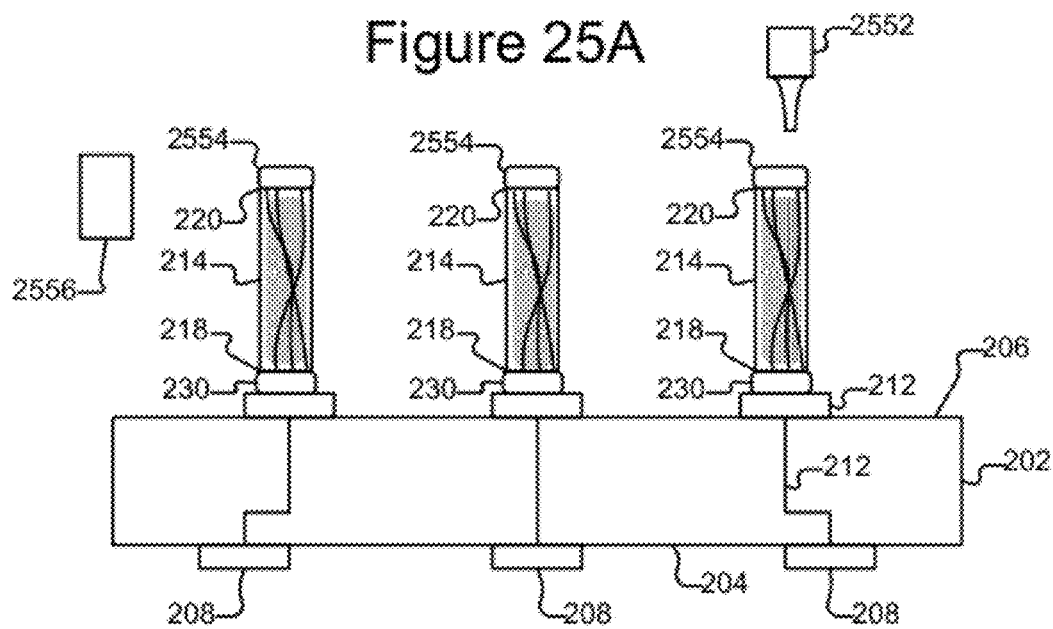
FIGS. 25A and 25B illustrate another example of forming contact tips at the ends of the columns using a nanopaste according to some embodiments of the invention.
Figure 25B:
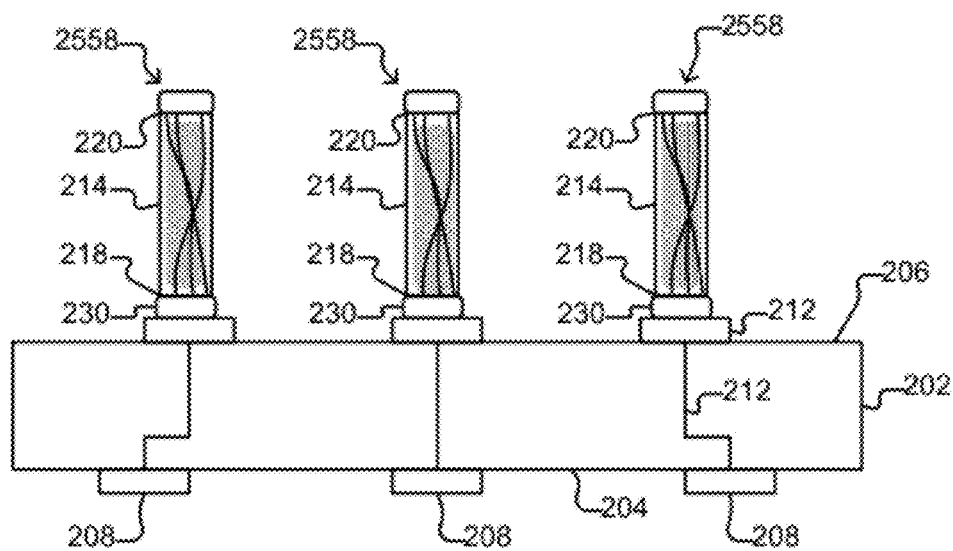

Referring again to the process 100 of FIG. 1, contact tips can be provided at ends of the columns 214. FIGS. 21A, 21B, and 22 illustrate an example of providing contact tips 2102 at ends 220 of the columns 214, and FIG. 24 illustrates another example of providing contact tips 2402 at ends 220 of the columns 214. FIGS. 25A and 25B illustrates yet another example of providing contact tips As shown in FIG. 21A, a masking material 2106 (e.g., like the masking material 1704 or 2004) can be deposited on the wiring substrate 202, and the ends 220 of the columns 214 can extend out of the masking material 2106 and thus be exposed. The exposed ends 220 of the columns 214 can then be roughened to create sharp structures at the ends 220 of the columns 214. For example, the ends 220 of the columns can be subjected to a plasma treatment that creates sharp structures at the ends of the columns 214. FIG. 21B shows a photograph of an end 220 of a column of carbon nanotubes 214 illustrating examples of such sharpened structures 2110. The masking material 2106 can protect the portions of the columns 214 that are encased in the masking material 2106 from such treatment.

The roughened ends 220 of the columns 214 can then be metalized by depositing an electrically conductive metal 2104 (e.g., gold, silver, copper, etc.) on the roughened ends 220. As shown in FIG. 21A, the masking material 2106 can prevent the metal 2104 from depositing on the wiring substrate 202 and anywhere on the columns 214 except the exposed ends 220. Alternatively, as shown in FIG. 22, masking material 2206 (which can be masking material 2106 partially removed or new masking material deposited on the wiring substrate 202 after removing masking material 2106) can expose more of the columns 214 so that the metal 2104 deposits not only at the ends 220 of the columns but also on the portions of the columns that are exposed through the masking material 2206 (which can be like masking material 2106). Regardless, after metalizing with metal 2104, the masking material 2106 or 2206 can be removed. The metalized, roughened end 220 of each column can be a contact tip 2102, which can be an example of the contact tip 228 of FIGS. 2A and 2B.

Figure 23A:
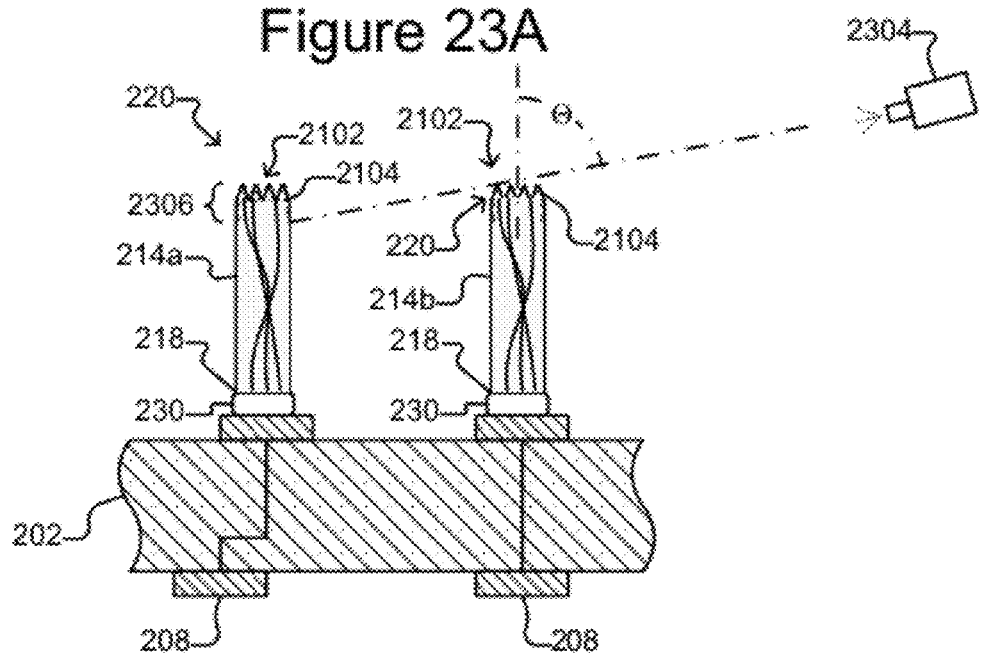
FIG. 23A illustrates an example of depositing metal onto contact tips of carbon nanotube columns according to some embodiments of the invention.

FIG. 23A illustrates another example of metalizing the ends 220 of the columns 214 with metal 2104 in which a sputtering apparatus 2304 sputters the metal 2104 onto end portions 2306 of the columns 214 in a process that can be similar to the process illustrated in FIG. 18. In the example of FIG. 23A, a sputtering apparatus 2304 can be disposed at an angle θ with respect to the columns 214 (e.g., with respect to an axis that is parallel with the length of the columns). The angle θ can be selected such that adjacent columns 214 mask each other and the metal 2104 sputtered onto the columns 214 is sputtered only onto an end portion 2306 of the columns 214. As shown in FIG. 23A, column 214*b* partially masks the sputtering apparatus 2304, and metal 2104 is consequently not sputtered onto portions of the adjacent column 214*a* other than the end portion 2306. The angle θ can be selected so that an end portion 2306 of a column 214 is less than the entire length of the column from end 218 to end 220. For example, in some embodiments, end portion 2306 can be less than 5%, less than 10%, less than 15%, less than 20%, or less than 25% of the length of a column 214 from end 218 to end 220. In other embodiments, the end portions 2306 can be other percentages of the length of a column 214 from end 218 to end 220. In some embodiments, the sputtering apparatus 2304 can be moved and positioned at different angles and from different locations with respect to the wiring substrate 202 and the ends 220 of the columns 214 in order to metalize the end portions 2306 of the columns 214 on the wiring substrate 202.

Figure 23B:
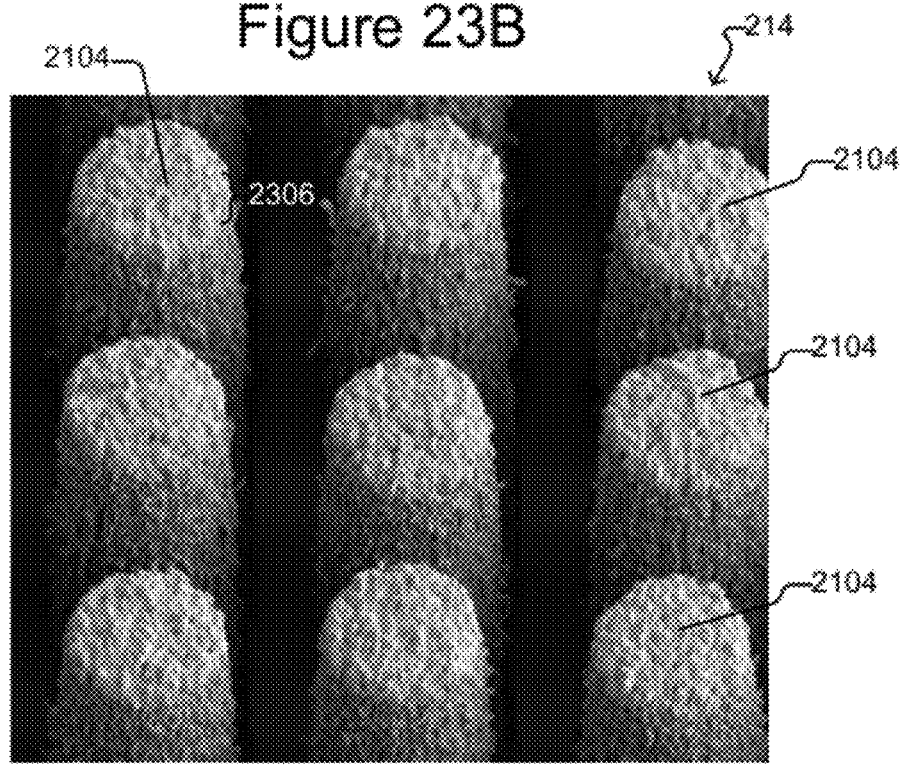
FIG. 23B shows a photograph of ends of carbon nanotube columns onto which metal has been deposited.

FIG. 23B shows a photograph of carbon nanotube columns 214 with metal 2104 deposited only on end portions 2306 of the columns 214. In FIG. 23B, the metal 2104 is a lighter color than the portions of the columns 214 on which metal 2104 is not deposited.

FIG. 24 illustrates another example of providing contact tips at ends 220 of the columns 214 and thus represents an alternative to the processes illustrated in FIGS. 21A, 21B, 22, 23A, and 23B. As shown, contact tip structures 2402 can be provided on a substrate 2406. For example, the contact tip structures 2402 can be fabricated on the substrate 2406 in a pattern that corresponds to the pattern of the ends 220 of the columns 214 on the wiring substrate 202. The contact tip structures 2402 can be joined to the ends 220 of the columns 214 by a coupling 2404 and then separated from the substrate 2406. The coupling 2404 can be any suitable material for joining tip structures 2402 to the ends 220 of the columns 214. For example, the coupling 2404 can comprise solder or a similar joining material. As another example, the coupling 2404 can comprise a sintered nanopaste (e.g., like nanopaste 1202) like the fillet 1402 in FIG. 14. The contact tip 2402 can be an alternative example of the contact tip 228 of FIGS. 2A and 2B.

FIGS. 25A and 25 illustrate another example of providing contact tips 228 at ends 220 of the columns 214 and thus represents an alternative to the processes illustrated in FIGS. 21A, 21B, 22, 23A, 23B, and 24. As shown in FIG. 25A, nanopaste 2554 comprising particles of a conductive material can be deposited on ends 220 of the columns 214. The nanopaste 2554 can comprise particles of an electrically conductive material (e.g., gold, silver, copper, or similar metals) in a solvent. The particles can be nanoparticles. In some embodiments, the nanopaste 2554 can also include microparticles and/or sharp particles, which can be a hard material such as rhutenium or rhodium.

The nanopaste 2554 can be deposited onto ends 220 of the columns 214 in any suitable manner. For example, as shown in FIG. 25A, in some embodiments, the nanopaste 2554 can be printed through a print head 2552 (e.g., an inkjet print head) onto the ends 220 of the columns 214. Alternatively, the nanopaste 2554 can be deposited onto the ends 220 of the columns 214 using other methods such as screen printing, a mask, etc. The nanopaste 2554 can then be cured. For example, the nanopaste 2554 can be heated using a temperature control device 2556 (e.g., a heater) to a temperature and for a time sufficient to cure the nanopaste 2554. In some embodiments, the nanopaste can be sintered.

As shown in FIG. 25B, the cured nanopaste can form contact tips 2558 at ends 220 of the columns. The nanoparticles can form an electrically conductive coating at the ends 220 of the columns. The contact tips 2558 can be yet another example of the contact tip 228 of FIGS. 2A and 2B.

Figure 26:
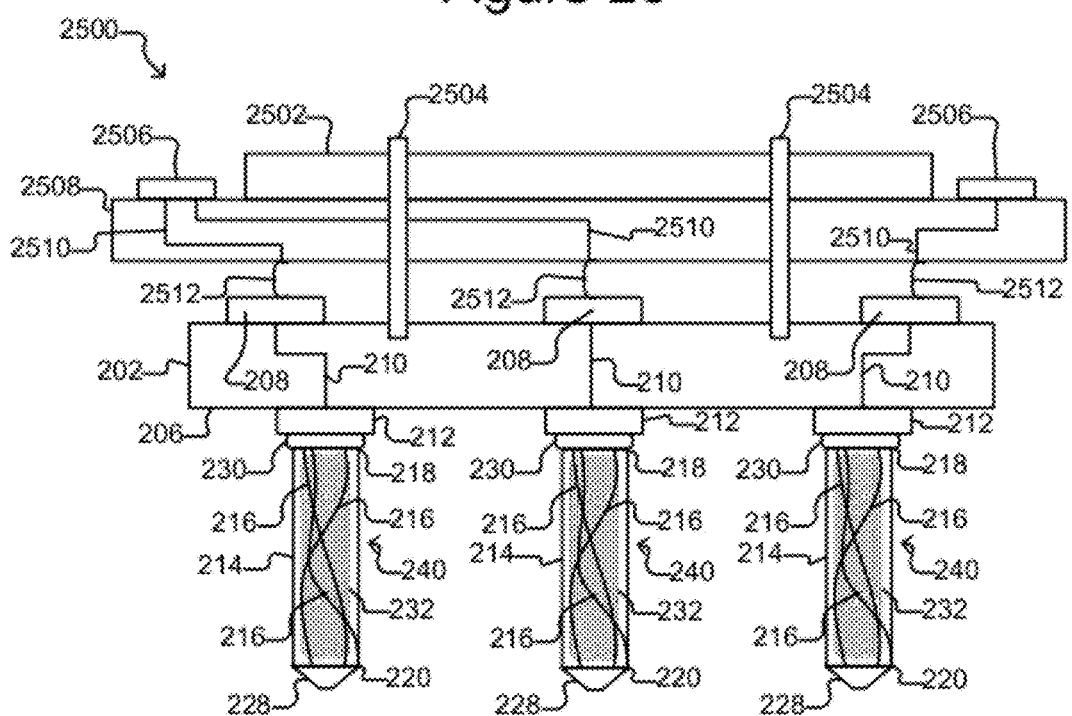
FIG. 26 illustrates an example of a probe card assembly with probes that comprise carbon nanotube columns according to some embodiments of the invention.

Referring again to the process 100 of FIG. 1, at step 110, the wiring substrate 202 can be coupled to one or more other elements to form an electronic apparatus. FIG. 26 illustrates an example in which the wiring substrate 202 is coupled to other electronic elements to form a probe card assembly 2500, and FIG. 27 illustrates an example of a test system 2600 in which the probe card assembly 2500 can be used to contact and test devices under test (DUTs) 2618.

The probe card assembly 2500 can include a stiffener structure 2502 and a wiring board 2508 to which the wiring substrate 202 can be physically and electrically coupled as an example of step 110 of FIG. 1. As shown in FIG. 26, coupling mechanisms 2504 can physically coupled the wiring substrate 202 to a stiffener structure 2502, which can be a rigid structure (e.g., comprising metal or another rigid material) that impart rigidity to the probe card assembly 2500. The stiffener 2502 can also include means (not shown) to couple the probe card assembly 2500 to a mounting surface 2610 of the housing 2620 in the test system 2600 of FIG. 27. The coupling mechanisms 2504 can comprise any mechanism suitable for physically coupling the wiring substrate 202 to the stiffener 2502. For example, the coupling mechanisms 2504 can comprise screws, bolts, clamps, etc. In some embodiments, the coupling mechanisms 2504 can comprise moveable mechanisms such as differential screw assemblies (not shown) that moveably couple the wiring substrate 202 to the stiffener 2502.

Figure 27:
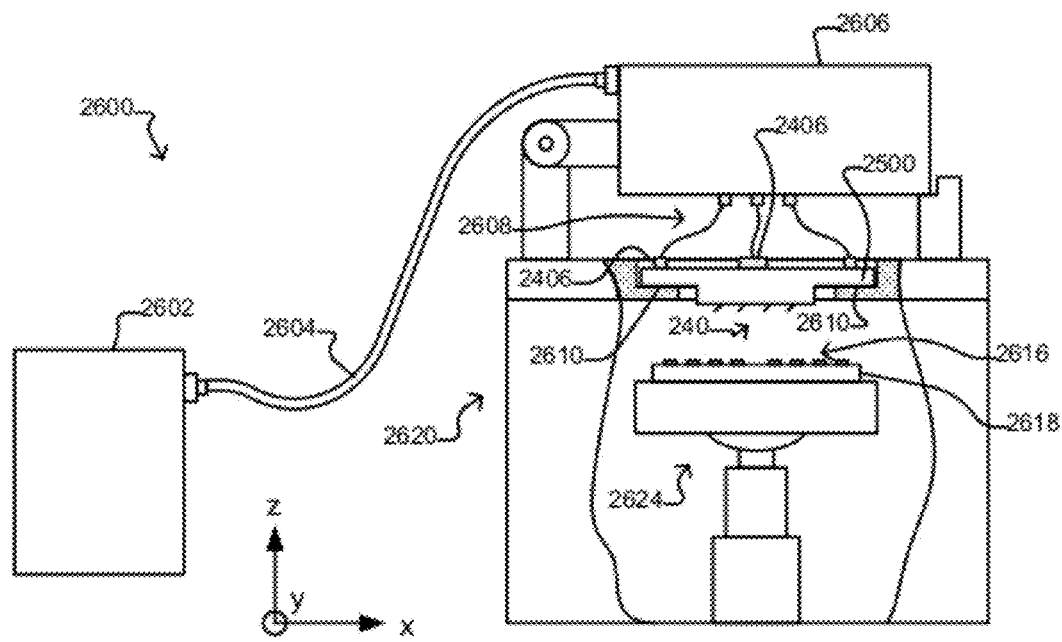
FIG. 27 illustrates an example of a test system for testing semiconductor dies in which the probe card assembly of FIG. 26 can be used according to some embodiments of the invention.

Still referring to FIG. 26, an electrical interface 2506 (e.g., zero-insertion-force (ZIF) electrical connectors, pogo pin pads, or other such electrical connectors) to individual communications channels to and from a test controller like the test controller 2602 in FIG. 27 can be disposed on the wiring board 2508. Electrical connections 2510 (e.g., electrically conductive vias and/or traces on and/or in the wiring board 2508) can provide electrical connections from the electrical interface 2506 through the wiring board 2508. The wiring board 2508 can be a semi-rigid substrate such as a printed circuit board or a rigid substrate such as a ceramic wiring board.

As shown in FIG. 26, electrical connections 2512 can electrically connect the electrical connections 2510 through the wiring board 2508 to the terminals 208 of the wiring substrate 202. The electrical connections 2512 can be any suitable connections that electrically connect the wiring board 2508 to the terminals 208. For example, the electrical connections 2512 can be flexible electrical connections such as flexible wires or an interposer (not shown). As another example, the electrical connections 2512 can be solder or other similar electrically conductive joining material.

The carbon nanotube columns 214 coupled to the terminals 212 of the wiring substrate 202 can be spring probes 240, and the contact tips 228 can be arranged in a pattern that corresponds to DUTs 2618 to be tested in the test system 2600 of FIG. 27. The acronym "DUT" can mean "device under test," which can be any electronic device including without limitation semiconductor dies (singulated or in wafer form, packaged or unpackaged). As shown in FIG. 26, the probe card assembly 2500 electrically connects each probe 240 through a terminal 212, an electrical connection 210 through the wiring substrate 202, a terminal 208, an electrical connection 2512, and an electrical connection 2510 through the wiring board 2508 to the electrical interface 2506.

As mentioned, the probe card assembly 2500 of FIG. 25 can be used to test electronic devices such as DUTs 2618 in FIG. 27, which illustrates an example of a test system 2600 in which the probe card assembly 2500 can be used. As shown in FIG. 27, the test system 2600 can include a test controller 2602, which can provide input signals to the DUTs 2618 and can receive response signals generated by the DUTs 2618 in response to the input signals. The term "test signals" can refer generically to either or both the input signals generated by the test controller 2602 and the response signals generated by the DUTs 2618. The probe card assembly 2500 can be coupled to a mounting surface 2610 of a housing 2620 (e.g., a prober) of the test system 2600. The probes 240 of the probe card assembly 2500 can make pressure-based electrical connections with terminals 2616 of the DUTs 2618, and the test signals can be passed between the test controller 2602 and the DUTs 2618 through communication connections 2604 (e.g., a coaxial cable, a wireless link, a fiber optic link, etc.), electronics (not shown) in a test head 2606, connectors 2608 between the test head 2606 and the electrical interface 2506 of the probe card assembly 2602, and the probe card assembly 2600. As shown, the probe card assembly 2600 can be coupled to the mounting surface 2610 of the housing 2620, which can include a moveable chuck 2624 on which the DUTs 2618 are disposed.

The DUTs 2518 can be tested as follows. The probe card assembly 2500 can be coupled to the mounting surface 2610 of the housing 2620, and terminals 2616 of the DUTs 2618 can be brought into contact with the probes 240 of the probe card assembly 2500. This can be accomplished by moving the chuck 2624 such that terminals 2616 of the DUTs 2618 are pressed against probes 240 of the probe card assembly 2500. Alternatively, the probe card assembly 2500 can be moved, or both the chuck 2624 and the probe card assembly 2500 can be moved to effect contact between the terminals 2616 and the probes 240.

While the probes 240 and terminals 2616 are in contact, the DUTs 2618 can be tested by providing test signals (which, as discussed above, can include input signals generated by the test controller 2602, and response signals generated by the DUTs 2618 in response to the input signals) between the test controller 2602 and the DUTs 2618 through the probe card assembly 2500. The test controller 2602 can analyze the response signals to determine whether the DUTs 2618 pass the testing. For example, the test controller 2602 can compare the response signals to expected response signals. If the response signals match the expected response signals, the test controller 2602 can determine that the DUTs 2618 passed the testing. Otherwise, the test controller 2602 can determine that the DUTs 2618 failed the testing. As another example, the test controller 2602 can determine whether the response signals are within acceptable ranges, and if so, can determine that the DUTs 2618 passed the testing.

The probe card assembly 2500 of FIG. 26 is an example only, and as discussed above with respect to FIGS. 2A and 2B, the carbon nanotube columns 214 discussed herein can be used in other electronic devices. For example, the carbon nanotube columns 214 can be used as contact probes in test sockets (not shown) for testing semiconductor dies or other electronic probing devices. The test system 2600 of FIG. 27 is also an example only, and the probe card assembly 2500 of FIG. 26 can be used in other test systems. In still other examples, carbon nanotube columns 214 can be used to assemble systems comprising multiple dies and wiring substrates (e.g., the carbon nanotube columns 214 can interconnect the dies and connect the dies to the wiring substrate).

Probes 240 comprising carbon nanotubes are not limited to use in a test system or probe card assembly like those illustrated in FIGS. 26 and 27.

Figure 28:
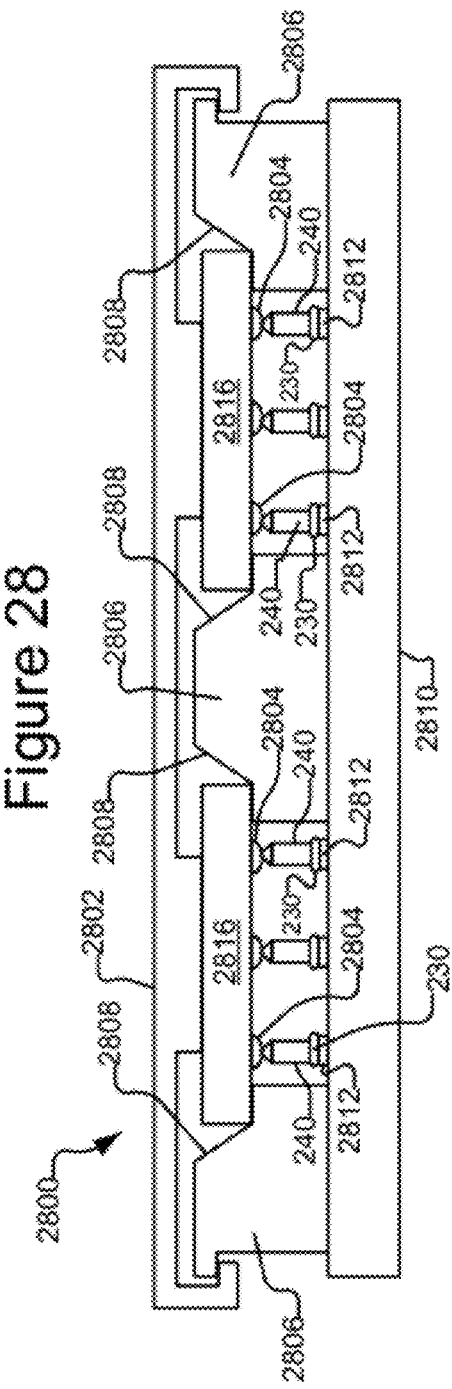
FIG. 28 illustrates an example of a test socket with probes that comprise carbon nanotube columns according to some embodiments of the invention.

FIG. 28 illustrates a non-limiting example in which probes 240 comprising carbon nanotubes can be used in a test socket 2800 in which probes 240 are coupled by coupling 230 to terminals 2812 of a test substrate 2810. FIG. 28 illustrates an exemplary test socket 2800 that can comprise a clip 2802, a support frame 2806, and a test substrate 2810 with terminals 2812 to which probes 240 can be coupled by coupling 230. The probes 240 can be coupled to the terminals 2812 of the test substrate 2810 by the coupling 230 in the same or similar ways as probes 240 are coupled to the terminals 212 of the substrate 202 as discussed above.

As shown in FIG. 28, test socket 2800 can be used to test electronic devices such as singulated semiconductor dies 2816 (packaged or unpackaged). The clip 2802 can be removed from the support frame 2806, allowing dies 2806 to be placed on the support frame 2806 as illustrated in FIG. 28. The support frame 2806 can comprise sloped walls 2808 that guide each die 2816 into a position in which terminals 2804 (e.g., bumps) of the die 2816 are in contact with probes 240. The clip 2802 can then be clipped onto the support frame 2806 and press the terminals 2804 of the dies 2816 against the probes 240 with sufficient force to establish electrical connections between the terminals 2804 of the dies 2816 and the probes 240. The wiring substrate 2010 can include electrical connections (not shown) from the terminals 2812—and thus the probes 240—to a test controller (not shown) for controlling testing of the dies 2816. Once the dies 2816 are tested, the clip 2802 can be removed from the support frame 2806, and the dies 2816 can be removed from the socket 2800. Rather than or in addition to being a test socket, socket 2800 can be an electronic system of which the dies 2816 and the substrate 2810 are a part. In such a case, the test substrate 2810 can alternatively or additionally be a wiring substrate that is part of the electronic system.

The test socket 2800 is an example only, and variations are possible. For example, although two dies 2816 are shown in FIG. 28, the test socket 2800 can be configured to hold more or fewer than two dies 2816. As another example, the clip 2802 and/or the support frame 2806 can be different shapes than shown in FIG. 28.

Figure 29:
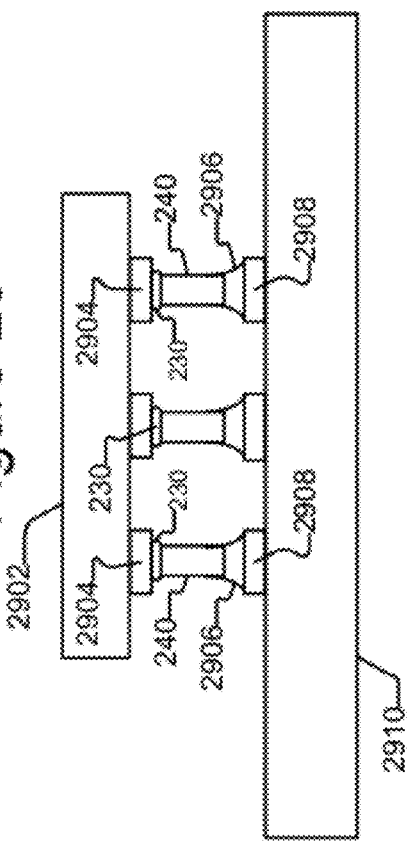
FIG. 29 illustrates electronic devices that are electrically connected by probes that comprise carbon nanotube columns according to some embodiments of the invention.

FIG. 29 illustrates a non-limiting example in which probes 240 comprising carbon nanotubes can be used to electrically connect two electronic devices 2902 and 2910. As shown, probes 240 can be coupled to the electronic device 2902 by the coupling 230. The probes 240 can be coupled to the terminals 2904 of the electronic device 2902 by the coupling 230 in the same or similar ways as probes 240 are coupled to the terminals 212 of the substrate 202 as discussed above. As also shown in FIG. 29, the probes 240 can be joined to terminals 2908 of the electronic device 2910 by a joining material 2906 (e.g., solder). The electronic device 2902 can thus be electrically connected to the electronic device 2910 by the probes 240. The electronic devices 2902 and 2910 can be any electronic devices that can be electrically connected one to another. For example, the electronic devices 2902 and 2910 can both be semiconductor dies (packaged or unpackaged). As another example, one of the electronic devices 2902 or 2910 can be such a semiconductor die and the other of the electronic devices 2902 or 2910 can be a printed circuit board. The configuration illustrated in FIG. 29 is an example only, and variations are possible. For example, the sizes, shapes, and positions of the electronic devices 2902 and 2910 can be other than shown in FIG. 29. As another example, there can be more than two electronic devices 2902 and 2910. As yet another example, one or both of the electronic devices 2902 and 2910 can have more or fewer than three terminals 2904 and 2908, and there can be more or fewer than three probes 240.

Although specific embodiments and applications of the invention have been described in this specification, these embodiments and applications are exemplary only, and many variations are possible.

We claim:

1. A probe card assembly comprising:
   a wiring substrate comprising an electrical interface to a tester for controlling testing of an electronic device to be tested; and
   a probe substrate comprising a plurality of probes disposed in a pattern that corresponds to terminals of the electronic device to be tested, each of the probes comprising a carbon nanotube column comprising a bundle of carbon nanotubes;
   adhesive material joints one of the carbon nanotube columns to one of a plurality of terminals of the probe substrate, each of the adhesive material joints comprising a mass of sintered nanoparticles fused to the one of the carbon nanotube columns and the one of the terminals, wherein the probe substrate is mechanically coupled to the wiring substrate and the probes are electrically connected through the probe substrate and the wiring substrate to the electrical interface.

2. The probe card assembly of claim 1, wherein each of the carbon nanotube columns comprises a plurality of alternating stiff regions and soft regions along the length of the carbon nanotube column, each soft region having a stiffness value that is less than a stiffness value of each of the stiff regions.

3. The probe card assembly of claim 1 further comprising an electrically conductive metal deposited on at least some of the carbon nanotubes disposed at an outside of each of the carbon nanotube columns, the metal enhancing an electrical conductivity of the carbon nanotube column.

4. The probe card assembly of claim 1 further comprising an electrically conductive metal deposited on at least some of the carbon nanotubes disposed inside each of the carbon nanotube columns, the metal enhancing an electrical conductivity of the carbon nanotube column.

5. The probe card assembly of claim 1, wherein:
first ends of the carbon nanotube columns are joined by the adhesive material joints to the terminals of the probe substrate, and
second ends of the carbon nanotube columns opposite the first ends comprise contact tips.

6. The probe card assembly of claim 5, wherein each contact tip comprises:
sharpened structures at the second end of the carbon nanotube column, and
electrically conductive metal deposited on the second end of the carbon nanotube column.

7. The probe card assembly of claim 5, wherein each contact tip comprises a contact tip structure coupled by a joining material to the second end of the carbon nanotube column.

* * * * *